United States Patent
Matsumoto

(10) Patent No.: US 9,689,665 B2
(45) Date of Patent: Jun. 27, 2017

(54) POSITION DETECTION APPARATUS, IMPRINT APPARATUS, AND METHOD FOR MANUFACTURING DEVICE

(71) Applicant: CANON KABUSHIKI KAISHA, Tokyo (JP)

(72) Inventor: Takahiro Matsumoto, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 28 days.

(21) Appl. No.: 13/719,061

(22) Filed: Dec. 18, 2012

(65) Prior Publication Data

US 2013/0163004 A1    Jun. 27, 2013

(30) Foreign Application Priority Data

Dec. 21, 2011 (JP) ................. 2011-279722

(51) Int. Cl.
| | |
|---|---|
| G01B 11/14 | (2006.01) |
| G03F 7/00 | (2006.01) |
| G03F 9/00 | (2006.01) |
| B82Y 10/00 | (2011.01) |
| B82Y 40/00 | (2011.01) |

(52) U.S. Cl.
CPC .............. G01B 11/14 (2013.01); B82Y 10/00 (2013.01); B82Y 40/00 (2013.01); G03F 7/0002 (2013.01); G03F 9/7042 (2013.01); G03F 9/7049 (2013.01)

(58) Field of Classification Search
CPC ..................................................... G01B 11/14
USPC ........................................................ 356/508
See application file for complete search history.

(56) References Cited

U.S. PATENT DOCUMENTS

| | | | |
|---|---|---|---|
| 4,988,197 A * | 1/1991 | Ishibashi et al. | 356/490 |
| 5,559,598 A * | 9/1996 | Matsumoto | 356/490 |
| 2010/0165291 A1* | 7/2010 | Sugita et al. | 351/206 |

FOREIGN PATENT DOCUMENTS

| | | |
|---|---|---|
| JP | 61-168226 A | 7/1986 |
| JP | 5-087529 A | 4/1993 |
| JP | H07-208923 A | 8/1995 |
| JP | H09-293663 A | 11/1997 |
| JP | 10-116770 A | 5/1998 |
| JP | 03352249 B2 | 12/2002 |

(Continued)

Primary Examiner — Tarifur Chowdhury
Assistant Examiner — Omar Nixon
(74) Attorney, Agent, or Firm — Canon USA, Inc. IP Division

(57) ABSTRACT

A position detection apparatus that illuminates diffraction gratings formed on two objects with light from a light source and receives diffracted light from the diffraction gratings to acquire relative positions of the two objects includes: an optical system configured to cause plus n-th order diffracted light and minus n-th order diffracted light from each of the diffraction gratings to interfere with each other, where n is a natural number; a light receiving unit; and a processing unit, wherein the light receiving unit receives a two-beam interference light from each of the diffraction gratings, and wherein the processing unit acquires the relative positions of the two objects by using the two-beam interference light at an area where two-beam interference lights of the diffracted light from the respective diffraction gratings do not overlap each other among the two-beam interference lights of the diffracted light from each of the diffraction gratings.

14 Claims, 20 Drawing Sheets

(56) References Cited

FOREIGN PATENT DOCUMENTS

| | | |
|---|---|---|
| JP | 2006-516065 A | 6/2006 |
| JP | 2010-169660 A | 8/2010 |
| JP | 2011-243664 A | 12/2011 |

* cited by examiner

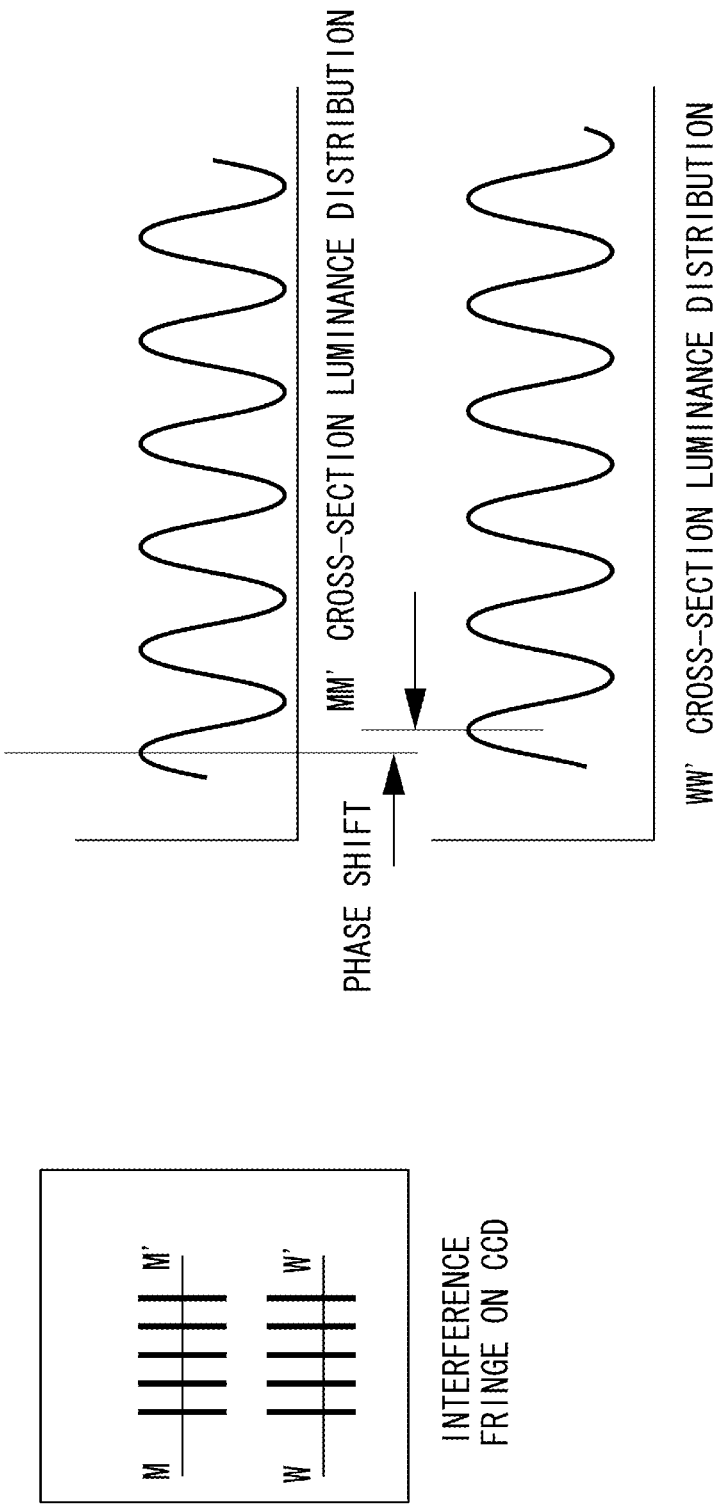

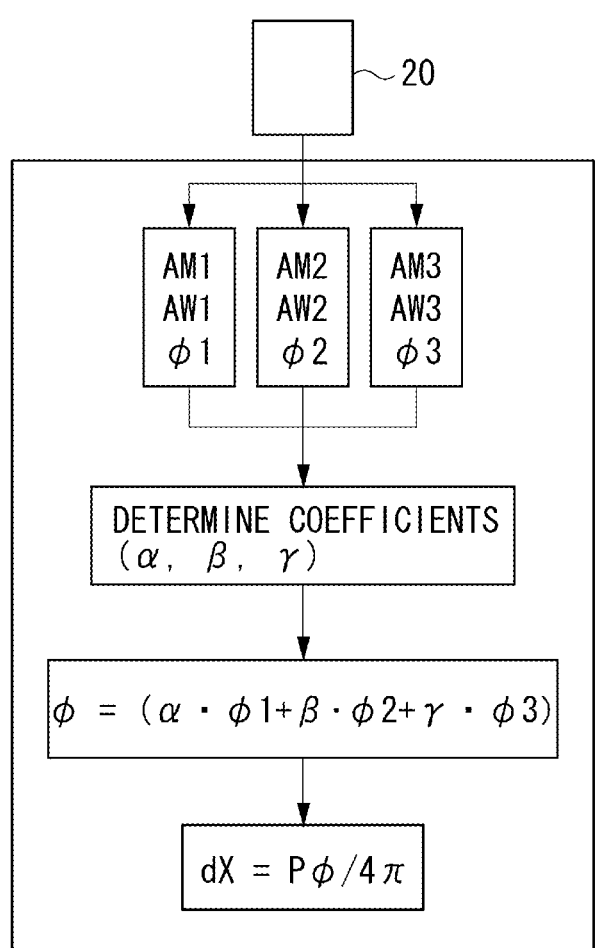

POSITION DETECTION APPARATUS, IMPRINT APPARATUS, AND METHOD FOR MANUFACTURING DEVICE

BACKGROUND OF THE INVENTION

Field of the Invention

The present invention relates to a position detection apparatus, an imprint apparatus, and a method for manufacturing a device.

Description of the Related Art

An imprint technology which is a technology that transfers a minute structure on a mold to a workpiece such as a resin or a semiconductor substrate has gained attention in recent years. The imprint technology can mass-produce semiconductor devices at low cost without needing a large-scale device such as a vacuum process, and the like.

In the imprint technology, a workpiece formed by applying the resin onto a substrate in advance is prepared. As the resin, for example, a photo-curable resin or a thermosetting resin can be used. The resin on the substrate contacts a mold having a desired uneven pattern to fill the uneven pattern with the resin. The resin is cured through ultraviolet-light irradiating or heating while the resin and the mold contact each other. Thereafter, the cured resin and the mold are released from each other, and as a result, the uneven pattern is transferred to the workpiece.

As an alignment method of the substrate and the mold, a method discussed in on Japanese Patent Application Laid-Open (Translation of PCT Application) No. 2006-516065 has been known. Light diffracted by a diffraction grating formed on the mold and a diffraction grating formed on the substrate is detected to measure a relative position between the substrate and the mold.

However, in a position detection apparatus discussed in Japanese Patent Application Laid-open (Translation of PCT Application) No. 2006-516065, the light diffracted by the diffraction grating of the mold is diffracted by a diffraction grating on a wafer. Light intensity received by a sensor is reduced by twice diffraction. In particular, since the diffraction grating on the wafer is formed by a wafer process, a surface step is not present or a minute step is formed, and a layer absorbing alignment light may be formed even on an upper layer of a mark, and diffraction efficiency remarkably deteriorates. Since the intensity of the alignment light is determined by multiplying diffraction efficiency of the diffraction grating of the mold by the deteriorated diffraction efficiency, the intensity of the alignment light received by the sensor deteriorates. When the intensity of the alignment detection light is decreased, an influence of electric noise of a detector and the like causes measurement precision of alignment to deteriorate.

SUMMARY OF THE INVENTION

The present invention is directed to improving detection precision of a position detection apparatus that detects a relative position between two objects.

According to an aspect of the present invention, a position detection apparatus that illuminates diffraction gratings formed on two objects with light from a light source and receives diffracted light from the diffraction gratings to acquire relative positions of the two objects includes: an optical system configured to cause plus n-th order diffracted light and minus n-th order diffracted light from each of the diffraction gratings to interfere with each other, where n is a natural number; a light receiving unit; and a processing unit, wherein the light receiving unit receives a two-beam interference light of the plus n-th order diffracted light and the minus n-th order diffracted light from each of the diffraction gratings formed on the two objects, and wherein the processing unit acquires the relative positions of the two objects by using the two-beam interference light at an area where two-beam interference lights of the diffracted light from the respective diffraction gratings do not overlap each other among the two-beam interference lights of the diffracted light from each of the diffraction gratings formed on the two objects, received by the light receiving unit.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 1A, 1B, and 1C are diagrams illustrating a position detection apparatus according to a first exemplary embodiment.

FIGS. 4A, 4B, and 4C are diagrams illustrating a processing method of a signal.

DESCRIPTION OF THE EMBODIMENTS

Various exemplary embodiments, features, and aspects of the invention will be described in detail below with reference to the drawings.

Figure 1A:
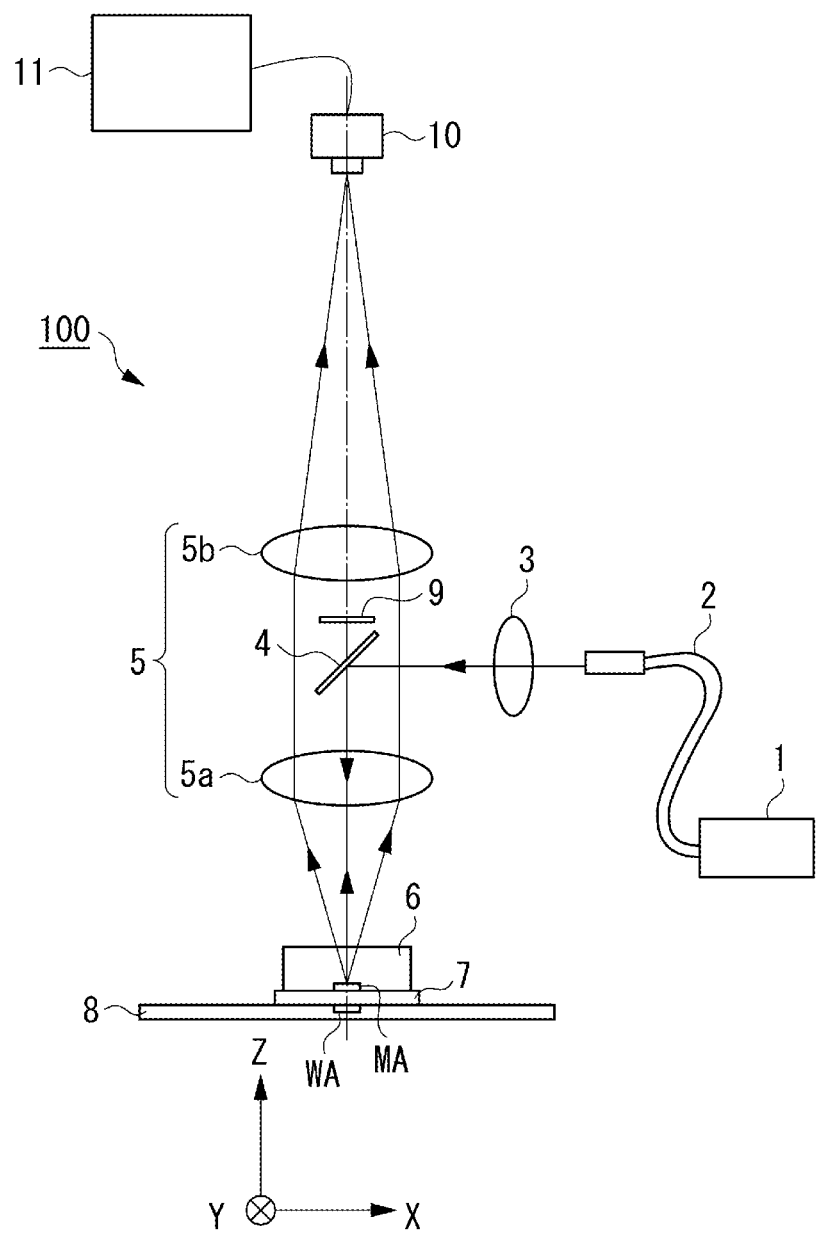
Figure 1C:
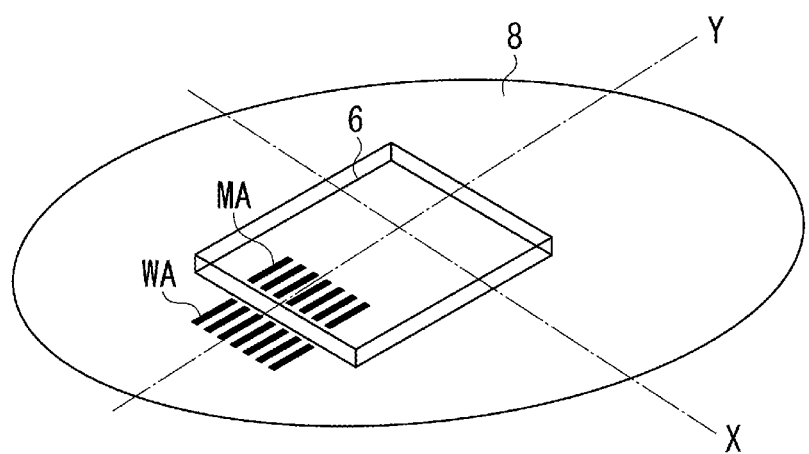

First, a first exemplary embodiment of the present invention will be described with reference to FIGS. 1A, 1B, and 1C, and FIGS. 2A, 2B, 2C, and 2D. FIGS. 1A, 1B, and 1C are diagrams illustrating a configuration of a position detection apparatus 100 according to the first exemplary embodiment and illustrate an example in which the present invention is applied to an alignment detecting device of an imprint apparatus. In the present exemplary embodiment described below, a position detection apparatus and a position detecting method that acquire a relative position by using a mold and a wafer as two different objects will be described.

The configuration of the position detection apparatus 100 will be described with reference to FIG. 1A. Light emitted from a light source 1 is guided to an illumination optical system 3 via an optical fiber 2. The light source 1 includes a low-coherence light source having a wideband wavelength width, such as a halogen light source and the like. The optical fiber 2 can be a bundle fiber formed by bundling a plurality of fibers. The light from the light source 1 forms a light intensity profile in the illumination optical system 3, and is deflected by a mirror 4 and, thereafter, is incident onto a mold 6 and a wafer 8 through a lens 5a constituting a detection optical system 5.

A thin resin 7 having a thickness in the range of several nm to 50 nm is interposed between the mold 6 and the wafer 8. A diffraction grating MA and a diffraction grating WA are formed on the mold 6 and the wafer 8, respectively, which are illuminated with the light from the light source 1. Reflected light (zeroth-order diffracted light), plus first-order diffracted light, and minus first-order diffracted light are generated from the diffraction grating MA and the diffraction grating WA, and are incident onto the lens 5a. A numerical aperture (NA) of the lens 5a is designed in such a manner that diffracted light of high-order of second-order or more is not received, throughout an illuminated wavelength band.

Further, the diffraction grating MA of the mold 6 and the diffraction grating WA of the wafer 8 are disposed to be shifted in a non-measurement direction (Y direction) perpendicular to a position measurement direction (X direction), as illustrated in FIG. 1C. The diffraction grating MA and the diffraction grating WA are disposed in such a manner as not to overlap each other as viewed from above. The plus first-order diffracted light and minus first-order diffracted light of the diffraction grating MA of the mold 6 and the diffraction grating WA of the wafer 8 are incident onto a lens 5b. Since the zeroth-order diffracted light from the diffraction grating MA of the mold 6 and the diffraction grating WA of the wafer 8 is blocked by a light shielding plate 9, the zeroth-order diffracted light is not incident onto the lens 5b. The lenses 5a and 5b constitute the detection optical system 5, and the bottom of the mold 6 (a substantially similar position to the top of the wafer 8) may be image-formed on a light receiving surface of a charge-coupled device (CCD) 10 (light receiving unit). An imaging magnification of the detection optical system 5 is in the range of approximately 10 times to 50 times.

Plus first-order diffracted light and minus first-order diffracted light from the diffraction grating MA of the mold 6 are caused to overlap each other on the light receiving surface of the CCD 10 by the detection optical system 5. The plus first-order diffracted light and minus first-order diffracted light of the diffraction grating WA of the wafer 8 also similarly overlap each other on the light receiving surface of the CCD 10. FIG. 1B schematically illustrates an intensity distribution of an interference fringe on the CCD 10. A sinusoidal intensity distribution is acquired due to an interference fringe of two-beam interference light beams. Further, FIG. 1B illustrates an example of a light intensity distribution of one line (MM' or WW') received by the CCD 10. As such, the detection optical system 5 is an optical system that forms two-beam interference light by diffracted light from a diffraction grating.

In this case, in an image obtained from interference light that is diffracted by the diffraction grating, which is received by the CCD 10, an interference fringe MM' from the diffraction grating MA and an interference fringe WW' from the diffraction grating WA are shifted from each other in the non-measurement direction, as illustrated in FIG. 1B. Since an interference fringe from the diffraction grating, which is imaged by the CCD 10 is formed by the two-beam interference light due to the plus first-order diffracted light and minus first-order diffracted light, the interference fringe becomes a two-beam interference fringe as illustrated in FIG. 1B. That is, when both grating pitches of the diffraction grating MA and the diffraction grating WA are set as P, the interference fringe becomes a striped pattern having a cycle obtained by multiplying the imaging magnification of the detection optical system 5 by a half of the grating pitch P.

The interference fringe formed as described above is processed by a signal processing unit 11, and a relative position deviation between the diffraction grating MA and the diffraction grating WA is acquired. In actual processing of the interference fringe, an intensity distribution is used, in which several to dozens of lines corresponding to sizes in the non-measurement direction of the diffraction grating MA and the diffraction grating WA are integrated. In this case, two-beam interference light beams at an area where images of respective diffraction gratings do not overlap each other are used.

As illustrated in FIG. 1B, when the mold 6 and the wafer 8 shift from each other in the measurement direction (X direction), the interference fringes of the diffraction grating MA and the diffraction grating WA are relatively phase-shifted. A diffraction grating having the same pitch P is formed in both the diffraction grating of the mold side and the diffraction grating of the wafer side. In a method of calculating a phase shift φ, for example, fast Fourier transform is performed, a frequency component which depends on the pitch of the two-beam interference fringe is extracted, and a phase of the frequency component may be acquired to detect phases of interference fringes corresponding to the respective diffraction gratings. Accordingly, the phase shift φ can be acquired by Equation (1), when a phase of the interference fringe from the diffraction grating MA is set as φm and a phase of the interference fringe from the diffraction grating WA is set as φw.

$$\phi=\phi m-\phi w \tag{1}$$

Further, since the pitch of the two-beam interference fringe corresponding to a phase difference of 2π becomes P/2 through positional conversion of the mold (and wafer), a relative position deviation dX of the mold 6 and the wafer 8 can be acquired by Equation (2) below.

$$dX=P\times\phi/4\pi \tag{2}$$

Herein, a location where the phase shift φ of the interference fringe from the diffraction grating MA and the diffraction grating WA is 0 is described as the relative position deviation dX=0. However, for example, when the phase shift of the interference fringe occurs in advance by a manufacturing error of the diffraction grating and the like, the relative position deviation dX is not particularly 0. The phase shift which occurs in advance may be reflected to Equation (2) as an offset.

As described above, the relative position detecting method has been described by using the X direction as the measurement direction, but the relative position may be detected similarly by rotating a detection mark in the X direction at 90° even with respect to the Y direction. In this case, the relative position may be acquired in the same method as described above by using the Y direction as the measurement direction and the X direction as the non-measurement direction.

Figure 2A:
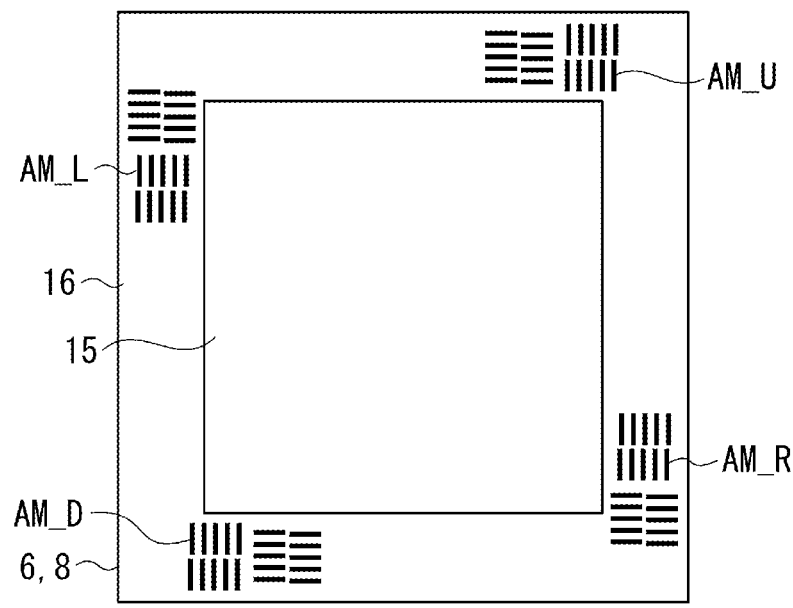
FIGS. 2A, 2B, 2C, and 2D are diagrams illustrating a diffraction grating to be detected by the position detection apparatus.

An arrangement method of the diffraction grating will be described with reference to FIGS. 2A, 2B, 2C, and 2D. FIGS. 2A, 2B, 2C, and 2D illustrate a diagram when the mold 6 and the wafer 8 are viewed from a Z direction of the position detection apparatus 100. FIG. 2A illustrates an example in which the diffraction grating is disposed at a position corresponding to one shot area on the wafer. The diffraction grating is formed on the mold 6 and the wafer 8 so that diffraction grating groups AM_D, AM_R, AM_U, and AM_L are configured at respective sides on a scribe line 16 outside a circuit pattern area 15 of a shot on the wafer.

Figure 2B:
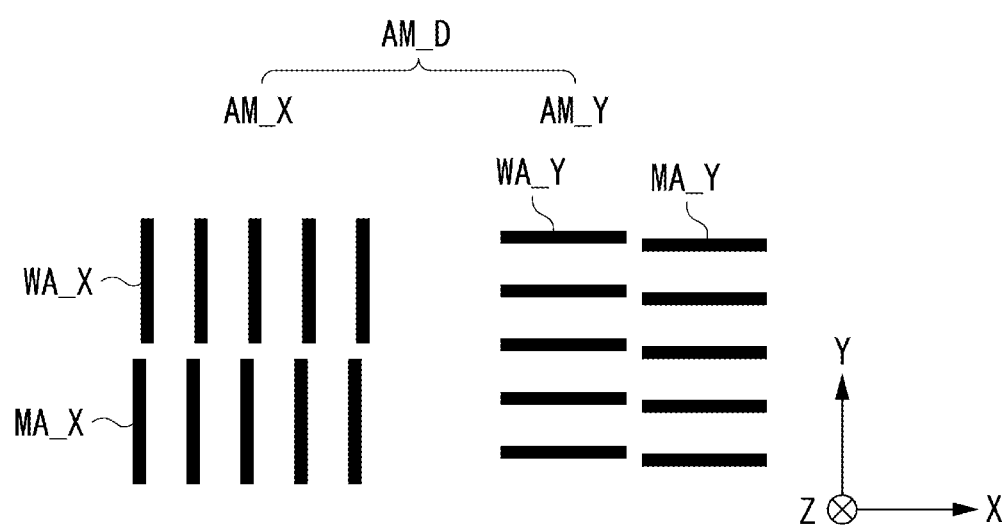

A configuration of the diffraction grating group disposed on each side of the scribe line 16 will be described with reference to FIG. 2B. FIG. 2B illustrates a configuration of the diffraction grating group AM_D disposed on a lower side of the scribe line 16. As illustrated in FIG. 2B, the diffraction grating group AM_D includes an X-directional measurement diffraction grating AM_X and a Y-directional measurement diffraction grating AM_Y. The diffraction grating AM_X includes a diffraction grating WA_X formed on the wafer and a diffraction grating MA_X formed on the mold. The diffraction grating AM_Y includes a diffraction grating WA_Y formed on the wafer and a diffraction grating MA_Y formed on the mold. The X-directional measurement diffraction grating WA_X and the Y-directional measurement diffraction grating WA_Y are provided on the wafer 8. The X-directional measurement diffraction grating MA_X and the Y-directional measurement diffraction grating MA_Y are provided on the mold 6. Besides, the diffraction grating groups AM_R, AM_U, and AM_L have configurations obtained by rotating the diffraction grating group AM_D counterclockwise at 90°, 180°, and 270°, respectively.

An X-directional relative position is acquired by using the diffraction grating WA_X and the diffraction grating MA_X, and a Y-directional relative position is acquired by using the diffraction grating WA_Y and the diffraction grating MA_Y. The method of detecting the relative position from the respective diffraction gratings may use the aforementioned relative position detecting method.

As such, the aforementioned position detection apparatus is disposed at positions corresponding to the diffraction grating groups AM_U, AM_D, AM_L, and AM_R provided on each side of the scribe line and may detect relative positions of the respective diffraction grating groups. By this configuration, in regard to four locations in the shot, the relative positions of the mold 6 and the wafer 8 in the X direction and the Y direction may be detected. Accordingly, in regard to the shot and the mold, X and Y-directional deviations of shift, magnification, rotation, a trapezoidal component may be acquired.

Figure 2C:
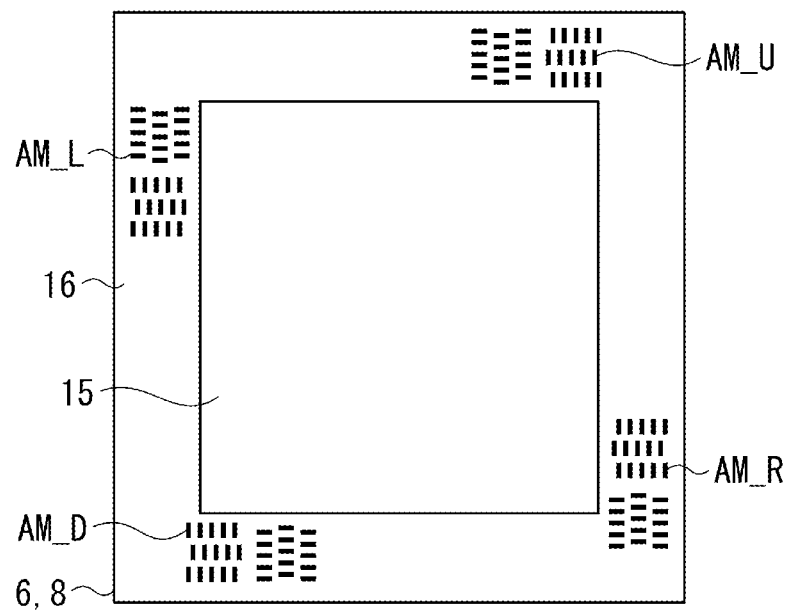
Figure 2D:
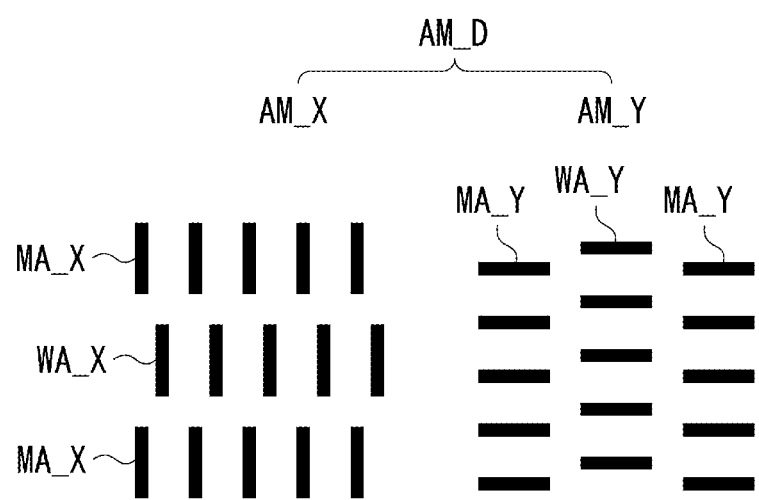

A diffraction grating group configured by a mark having a different shape from above will be described with reference to FIGS. 2C and 2D. As illustrated in FIG. 2D, a unidirectional position may be measured with three diffraction gratings. FIG. 2D illustrates a configuration of the diffraction grating group AM_D disposed on the lower side of the scribe line 16. The diffraction grating group AM_D includes the X-directional measurement diffraction grating AM_X and the Y-directional measurement diffraction grating AM_Y.

The diffraction grating AM_X includes two diffraction gratings MA_X formed on the mold and a diffraction grating WA_X formed on the wafer, and the diffraction grating AM_Y includes two diffraction gratings MA_Y formed on the mold and a diffraction grating WA_Y formed on the wafer. In this case, the phase shift φ of the interference fringe may be acquired by the following Equation (3), when a phase of the interference fringe from a first diffraction grating MA of the mold is set as φm1, a phase of the interference fringe from a second diffraction grating MA of the mold is set as φm2, and a phase of the interference fringe from the diffraction grating WA of the wafer is set as φw.

$$\phi=(\phi m1+\phi m2)/2-\phi w \quad (3)$$

As described above, in the present exemplary embodiment, diffraction gratings are provided on two different objects, e.g., the mold and the wafer, and a sine wave signal is generated by two-beam interfering plus first-order diffracted light and minus first-order diffracted light from each diffraction grating onto the light receiving surface of the CCD. Therefore, as compared with the related art in which the light is diffracted twice by the diffraction grating of the mold and the diffraction grating of the wafer, in the present exemplary embodiment, the light is diffracted only once by each diffraction grating. As a result, a light quantity can be increased. For example, in the twice diffraction methods in the related art, when both diffraction efficiencies of the diffraction gratings of the mold and the wafer are 1%, the light intensity is 0.01% by twice diffraction, but in the present exemplary embodiment, the light intensity is 1% and the light quantity is increased at 100 times by one-time diffraction. Measurement precision is improved as a result of the increase in light quantity.

In the present exemplary embodiment, the diffraction grating formed on the mold and the diffraction grating formed on the wafer do not at all overlap each other as illustrated in FIG. 1B or FIGS. 2A, 2B, 2C, and 2D. However, the diffraction grating formed on the mold and the diffraction grating formed on the wafer may partially overlap each other. When the diffraction grating formed on the mold and the diffraction grating formed on the wafer partially overlap each other, a phase shift between the interference fringe from the mold and the interference fringe from the wafer is acquired by using a phase (light receiving data) of an interference fringe at an area where two diffraction gratings do not overlap each other among the interference fringes detected at the light receiving surface of the CCD.

Since light other than plus first-order diffracted light and minus first-order diffracted light, such as the zeroth-order diffracted light or the high-order diffracted light of second-order or more, is configured not to be received, the sine wave signal is acquired. When a signal is expanded up to a saturation level of the CCD 10 by adjusting the light source 1 used in alignment, since the signal has only one frequency component of a sine wave, the sine wave signal having the target frequency becomes a significantly large signal. Meanwhile, when the light other than the plus first-order diffracted light and minus first-order diffracted light is also used as a signal, since the signal also becomes a signal in which different frequencies coexist, a signal intensity compared between the target frequency components is smaller than that of the present exemplary embodiment even though the intensity is adjusted so that a maximum intensity of the signal is at the saturation level of the CCD. Accordingly, when the phase of the frequency component of the sine wave signal is extracted, the intensity of the frequency component is large, and as a result, measurement precision is improved.

Although, in the present exemplary embodiment, the plus first-order diffracted light and minus first-order diffracted light are subjected to two-beam interference, other-order light beams may be subjected to two-beam interference. For example, plus second-order diffracted light and minus second-order diffracted light may be subjected to two-beam interference. In this case, zeroth-order diffracted light, plus first-order diffracted light, and minus first-order diffracted light from the diffraction gating are blocked by the light shielding plate 9. Furthermore, as described above, such a configuration is employed that light beams other than the plus second-order diffracted light and minus second-order diffracted light, such as third or higher-order diffracted light, are not received by the light receiving unit.

Furthermore, plus third-order diffracted light and minus third-order diffracted light may be subjected to two-beam interference. Thus, according to the present invention, such a configuration is employed that plus n-th order diffracted light and minus n-th order diffracted light are subjected to two-beam interference, where n is a natural number, and light beams other than plus n-th order diffracted light and minus n-th order diffracted light are blocked by the light shielding plate 9 and are not received by the light receiving unit.

When the light other than the plus first-order diffracted light and minus first-order diffracted light is also used as a signal, a diffraction grating image is changed by a gap between the mold and the wafer, while the sine wave signal which does not depend on the gap between the mold and the wafer is acquired in the two-beam interference of the plus first-order diffracted light and minus first-order diffracted light. A prealignment of the mold and the wafer may be performed with the mold and the wafer spaced apart from each other by several μm, before the mold and the wafer contact each other. Therefore, alignment may be performed with the mold and the wafer spaced apart from each other (close gap).

Further, interference fringes from the diffraction grating formed on the mold and the diffraction grating formed on a wafer stage (not illustrated) holding the wafer as a reference mark are detected, and a relative position between the mold and the wafer stage may be measured. In order to prevent the mold from being broken due to a contact between the mold and the reference mark, the mold and the wafer may be spaced apart from each other. As in the present exemplary embodiment, by using the two-beam interference light (interference fringe) of the plus first-order diffracted light and minus first-order diffracted light, a measurement error which depends on the gap between the mold and the wafer may be reduced.

The light is detected, which is diffracted twice by the diffraction gratings formed on the mold and the reference mark overlapping each other in the related art, but in the present exemplary embodiment, since the diffraction gratings formed on the mold and the wafer do not overlap each other, a decrease in light intensity may be suppressed and detection precision is improved.

Next, a second exemplary embodiment will be described. FIGS. 3A, 3B, 3C, and 3D are diagrams illustrating a configuration of a position detection apparatus 100 according to the second exemplary embodiment. In the second exemplary embodiment, a band-pass filter 19 that limits an illumination wavelength band from the light source 1 and a color CCD 20 as the light receiving unit are used, differently from the first exemplary embodiment. The same reference numerals as the first exemplary embodiment will not be described in detail. Differences from the first exemplary embodiment will be described in detail.

Figure 3A:
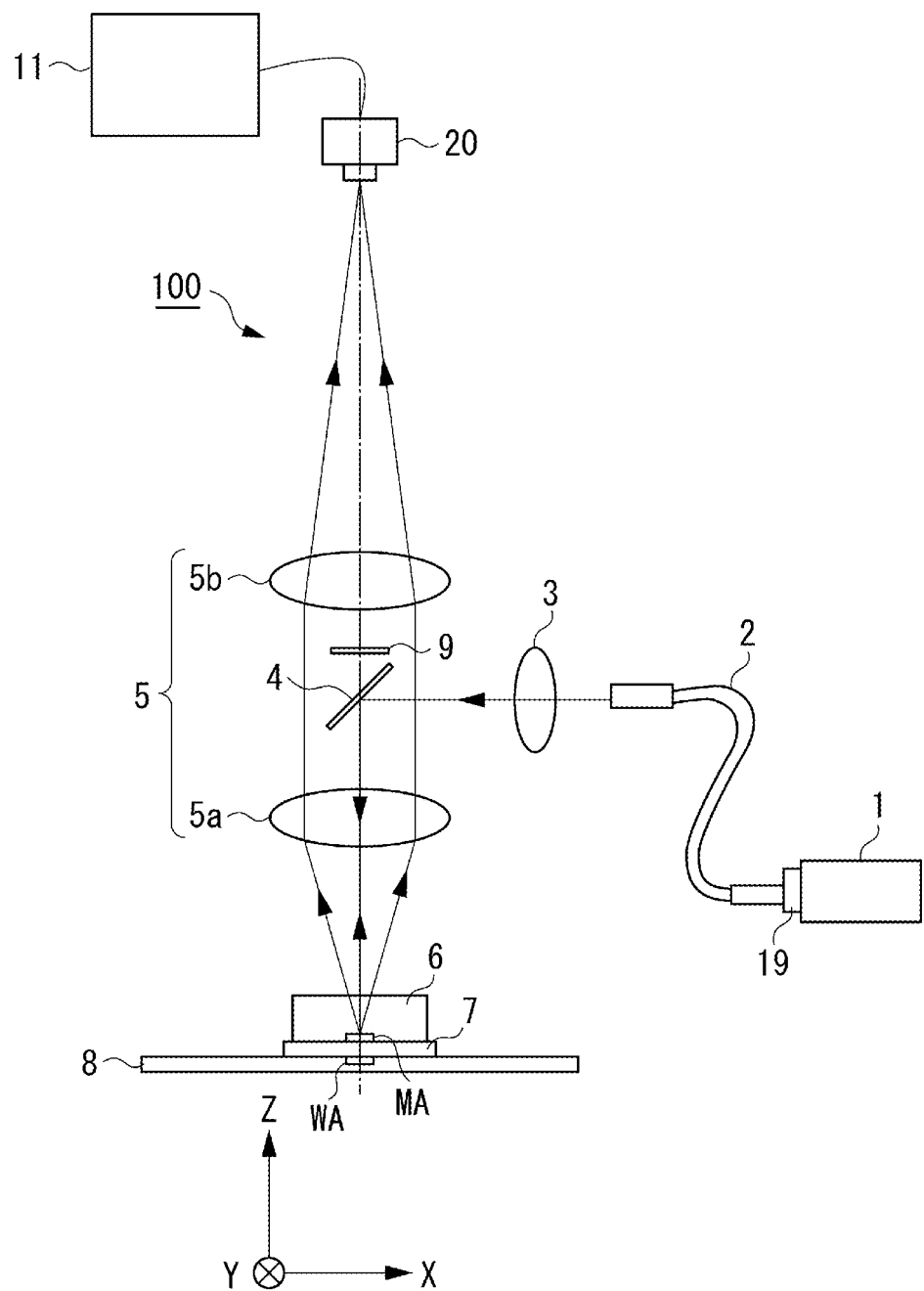
FIGS. 3A, 3B, 3C, and 3D are diagrams illustrating a position detection apparatus according to a second exemplary embodiment.

In FIG. 3A, light emitted from the light source 1 passes through the band-pass filter 19. Wavelength bands illuminated to the mold 6 and the wafer 8 are limited by the band-pass filter 19. Thereafter, the plus first-order diffracted light and minus first-order diffracted light, which are diffracted by the diffraction grating MA formed on the mold 6 and the diffraction grating WA formed on the wafer 8, pass through the detection optical system 5, and the two-beam interference light (interference fringe) by the diffracted light from the diffraction grating is formed on the light receiving surface of the color CCD 20.

Figure 3B:
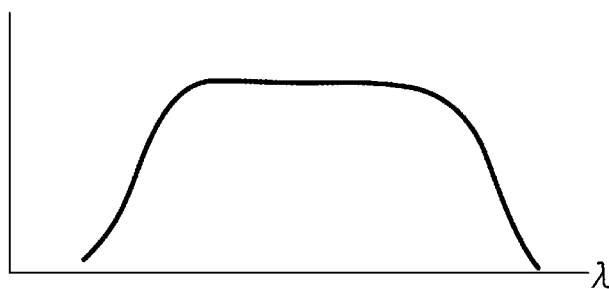
Figure 3C:
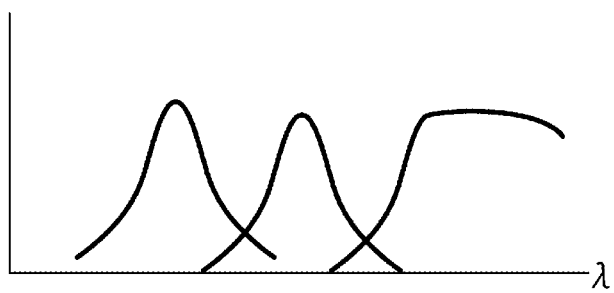
Figure 3D:
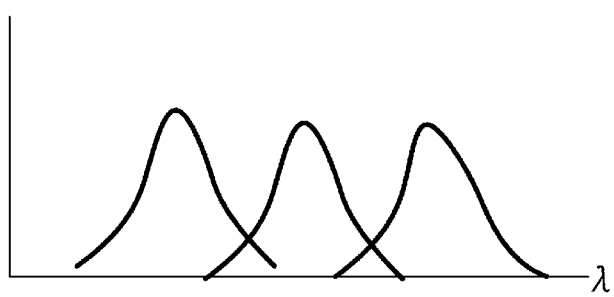

Herein, a characteristic of spectral transmittance of the band-pass filter 19 is illustrated in FIG. 3B, and a characteristic of spectral transmittance of each color filter of R, G, and B provided before a light receiving element of the color CCD 20 is illustrated in FIG. 3C. An output of R, G, and B of the color CCD 20 is acquired by multiplying the spectral transmittance of the band-pass filter 19 by the spectral transmittance of each color filter of R, G, and B of the color CCD 20, as illustrated in FIG. 3D.

By considering the above description, the spectral transmittances of the band-pass filter 19 and the respective color filters are designed so that respective signal intensities of R, G, and B are substantially the same as each other. The two-beam interference light (interference fringe) of the diffraction grating received by the color CCD 20 is divided into the respective colors of R, G, and B, and is processed by the signal processing unit 11.

Figure 4A:
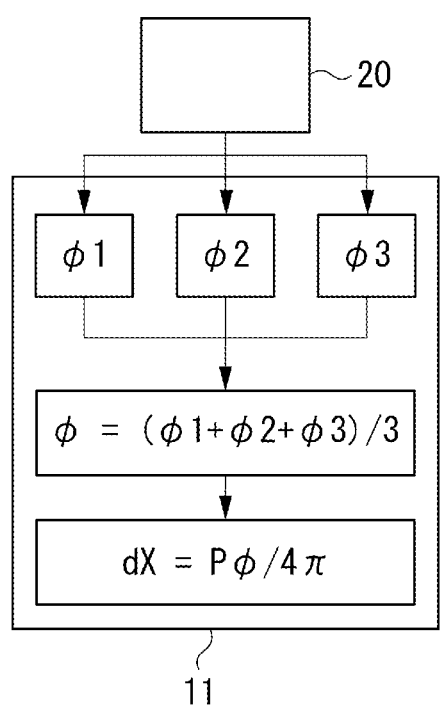

Hereinafter, in the second exemplary embodiment, a processing method of the two-beam interference fringes dispersed into the respective colors of R, G, and B will be described with reference to FIG. 4A. The two-beam interference fringes dispersed into the respective colors of R, G, and B captured by the color CCD 20 are processed by the signal processing unit 11, similarly as the first exemplary embodiment. A phase difference between the interference fringe from the diffraction grating MA on the mold and the interference fringe from the diffraction grating WA on the wafer is acquired with respect to the respective dispersed colors. The phase differences are set as $\phi 1$, $\phi 2$, and $\phi 3$.

Subsequently, an average value of the phase differences $\phi 1$, $\phi 2$, and $\phi 3$ is acquired by Equation (4) below.

$$\phi=(\phi 1+\phi 2+\phi 3)/3 \quad (4)$$

The relative position deviation dX between the mold 6 and the wafer 8 can be acquired by using Equation (2) described above.

As described above, the phase differences are acquired by dividing the two-beam interference light (two-beam interference fringe) of the diffracted light of the diffraction gratings formed on two different objects into a plurality of wavelength bands by using a color filter, which is a wavelength selecting unit, and a relative position of the two objects can be acquired based on the average value of the phase differences.

Figure 5A:
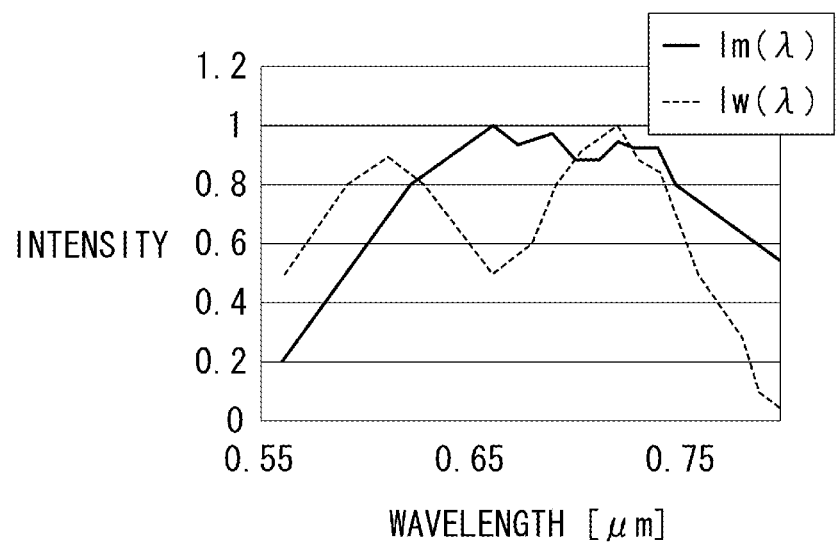
FIGS. 5A and 5B are diagrams illustrating wavelength dependency of the diffraction efficiency of a diffraction grating and an aberration of an optical system.

FIG. 5A illustrates a calculation example of wavelength characteristics of diffraction efficiencies of the diffraction grating MA formed on the mold 6 and the diffraction grating WA formed on the wafer 8. The diffraction efficiency Iw(λ) of the diffraction grating WA of the wafer 8 is illustrated by a dotted line and the diffraction efficiency Im(λ) of the diffraction grating MA of the mold 6 is illustrated by a solid line. In particular, since the diffraction grating WA of the wafer 8 is formed by a semiconductor process, a multilayer structure including films having different refractive indexes or a film absorbing alignment light is provided, and, as a result, the diffraction efficiency is easily changed by a wavelength.

Figure 5B:
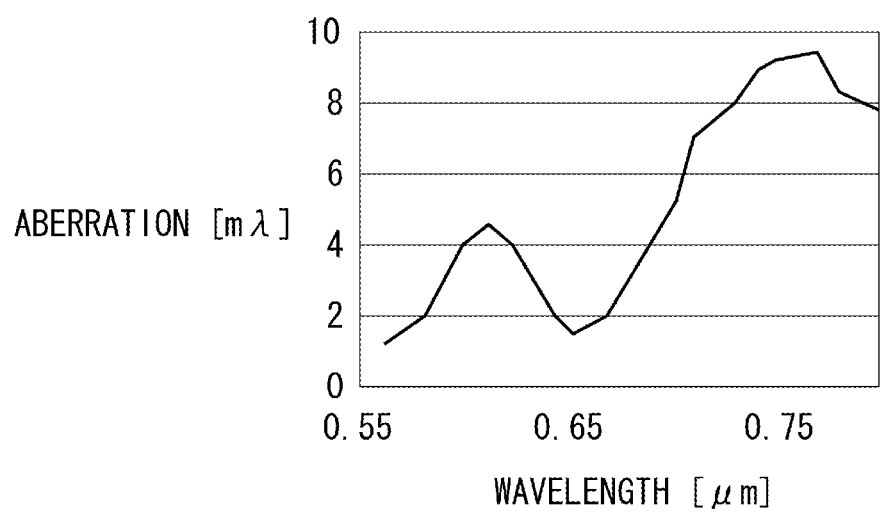

FIG. 5B illustrates an example of chromatic aberration occurring in the detection optical system 5. The diffraction grating MA of the mold 6 and the diffraction grating WA of the wafer 8 are disposed to be adjacent to each other. As a result, since the plus first-order diffracted light diffracted by the respective diffraction gratings passes through the substantially same optical path, the plus first-order diffracted light is influenced by the same aberration. The minus first-order diffracted light diffracted by the respective diffraction gratings is also similarly influenced by the same aberration. However, since the plus first-order diffracted light and the minus first-order diffracted light pass through different optical paths, the plus first-order diffracted light and the minus first-order diffracted light are influenced by different aberrations. The example illustrated in FIG. 5B represents a difference between aberrations occurring from the light paths of the plus first-order diffracted light and the minus first-order diffracted light generated by an influence of coma, which is asymmetric to an optical axis.

Further, since the plus first-order diffracted light and the minus first-order diffracted light are influenced by the same amount with respect to aberration that is symmetric to the optical axis, such as spherical aberration, the difference thereof is zero and an influence exerted on the phase of the two-beam interference fringe is small.

Next, with respect to a case where the mold and the wafer are different from each other in the wavelength characteristic of the diffraction efficiency of the diffraction grating and the detection optical system has a wavelength dependency of the coma, an influence thereof is considered.

First, an example of the two-beam interference fringe using light in all wavelength bands without selecting the wavelength will be described with reference to FIGS. 6A, 6B, and 6C. For a simple description, the example will be described when three wavelengths of λ1, λ2, and λ3 are used.

Figure 6A:
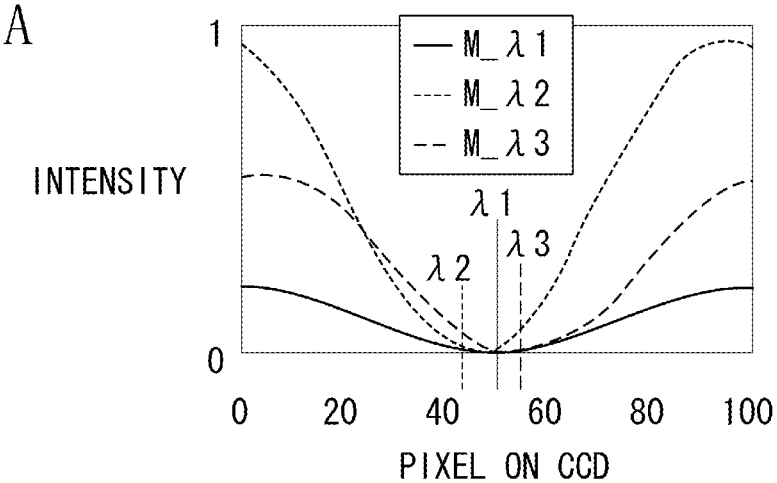
FIGS. 6A, 6B, 6C, 6D, 6E, and 6F are diagrams illustrating wavelength dependency of a two-beam interference fringe acquired from a diffraction grating.

FIG. 6A illustrates an example of the two-beam interference fringe for each wavelength acquired from the diffraction grating of the mold. As such, signal intensities detected from pixels on the CCD are different from each other as λ1, λ2, and λ3 due to the influence of the wavelength dependency of the diffraction efficiency. The positions (phases) of the two-beam interference fringes detected in the pixels on the CCD are different from each other as λ1, λ2, and λ3 by the influence of the wavelength dependency of the coma.

Figure 6B:
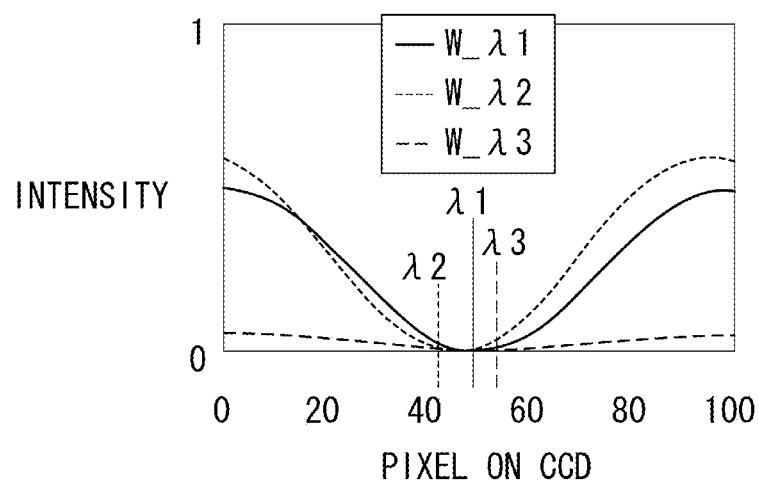

FIG. 6B illustrates an example of the two-beam interference fringe for each wavelength acquired from the diffraction grating of the wafer. As such, the signal intensities detected in the pixels on the CCD are different from each other as λ1, λ2, and λ3 due to the influence of the wavelength dependency of the diffraction efficiency. The positions (phases) of the two-beam interference fringes detected from the pixels on the CCD are also different from each other as λ1, λ2, and λ3 due to the influence of the wavelength dependency of the coma.

In the case where FIG. 6A and FIG. 6B are compared with each other for each wavelength, when the wavelengths are the same as each other, phase shift amounts generated by the influence of the wavelength dependency of the coma are the same as each other.

Figure 6C:
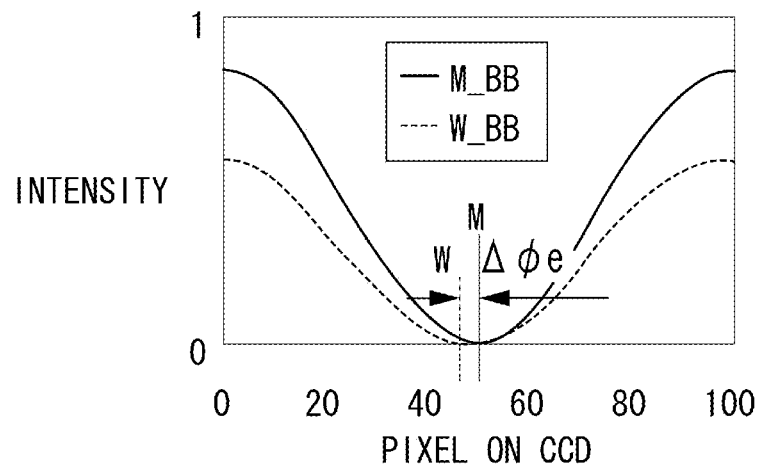

Next, FIG. 6C illustrates an example the two-beam interference fringe of the diffraction grating of the mold and the two-beam interference fringe of the diffraction grating of the wafer in the illumination wavelength band including the wavelengths λ1, λ2, and λ3. The two-beam interference fringe is a striped pattern actually acquired by the pixels on the CCD. As such, even when there is no positional deviation between the mold and the wafer, a phase difference Δϕe between both two-beam interference fringes is generated. Even though the phase shift amounts of the respective wavelengths λ1, λ2, and λ3 are the same, the signal intensities of the respective wavelengths are different from each other, and as a result, the phase difference is generated.

Figure 6D:
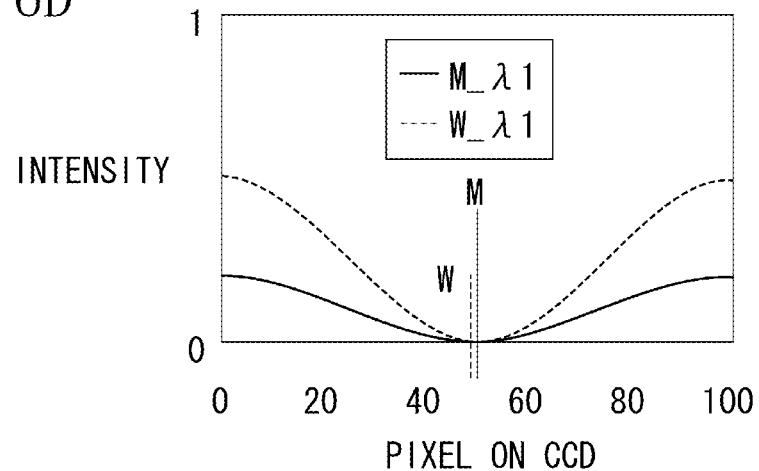
Figure 6E:
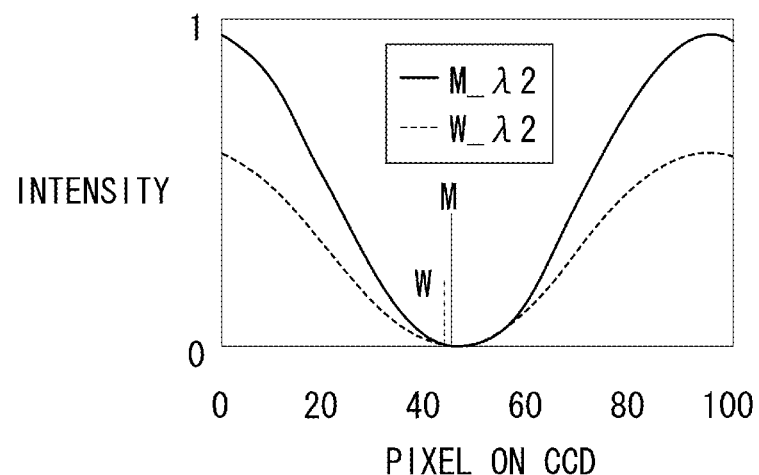
Figure 6F:
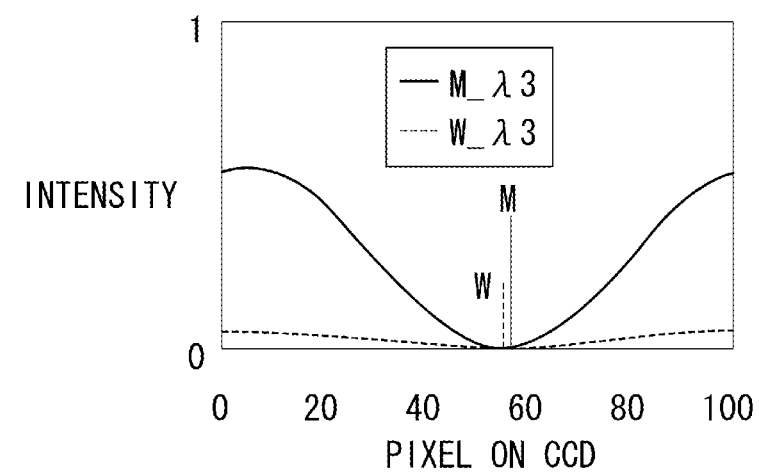

Next, as in the present exemplary embodiment, a case in which the light is dispersed in the wavelength selecting unit and two-beam interference fringes after the dispersion are individually processed will be described with reference to FIGS. 6D, 6E, and 6F. FIGS. 6D, 6E, and 6F illustrate an example in the case where there is no relative position deviation between the mold and the wafer.

FIG. 6D illustrates an example of the two-beam interference fringe of the diffraction grating of the mold and the two-beam interference fringe of the diffraction grating of the wafer of the wavelength λ1 after the dispersion. Since the two-beam interference fringe of the diffraction grating of the mold and the two-beam interference fringe of the diffraction grating of the wafer have different diffraction efficiencies, both two-beam interference fringes are different from each other in intensities of the signal. However, since both two-beam interference fringes are the same as each other in the influence due to the aberration, the shift amounts of the phases detected on the CCD are substantially the same as each other and the relative phase shift does not occur.

FIG. 6E illustrates an example of the two-beam interference fringe of the wavelength λ2, and FIG. 6F illustrates an example of the two-beam interference fringe of the wavelength λ3. The intensity of the two-beam interference fringe from the diffraction grating of the mold and the intensity of the two-beam interference fringe from the diffraction grating of the wafer are different from each other. However, the relative phase shift between the two-beam interference fringe from the diffraction grating of the mold and the two-beam interference fringe from the diffraction grating of the wafer does not occur.

As such, in FIGS. 6D, 6E, and 6F, the position detected from the pixel on the CCD is shifted while the phases of both two-beam interference fringes of the diffraction gratings of the mold and the wafer coincide with each other due to the influence of the coma. That is, the positions of both two-beam interference fringes on the CCD are changed for each wavelength, but the relative phase difference is not changed for each wavelength. As a result, the relative positions of the mold and the wafer may be detected with high precision, without being influenced by the wavelength dependency of the diffraction efficiency and the aberration, by detecting the two-beam interference fringe for each wavelength.

Further, for the simple description, a case of a single wavelength has been described, but a case where all wavelength bands are divided into predetermined wavelength bands by the wavelength selecting unit, and the two-beam interference fringe is processed for each of the predetermined divided bands has also the same effect.

Next, a position detection apparatus according to a third exemplary embodiment will be described with reference to FIGS. 3A, 3B, 3C, and 3D, and FIG. 4B. Further, the position detection apparatus according to the present exemplary embodiment has the same configuration as the position detection apparatus illustrated in FIG. 3A described in the second exemplary embodiment. The third exemplary embodiment is different from the second exemplary embodiment in the processing method of the signal executed by the signal processing unit 11. The processing method executed by the signal processing unit 11 will be described in detail.

Figure 4B:
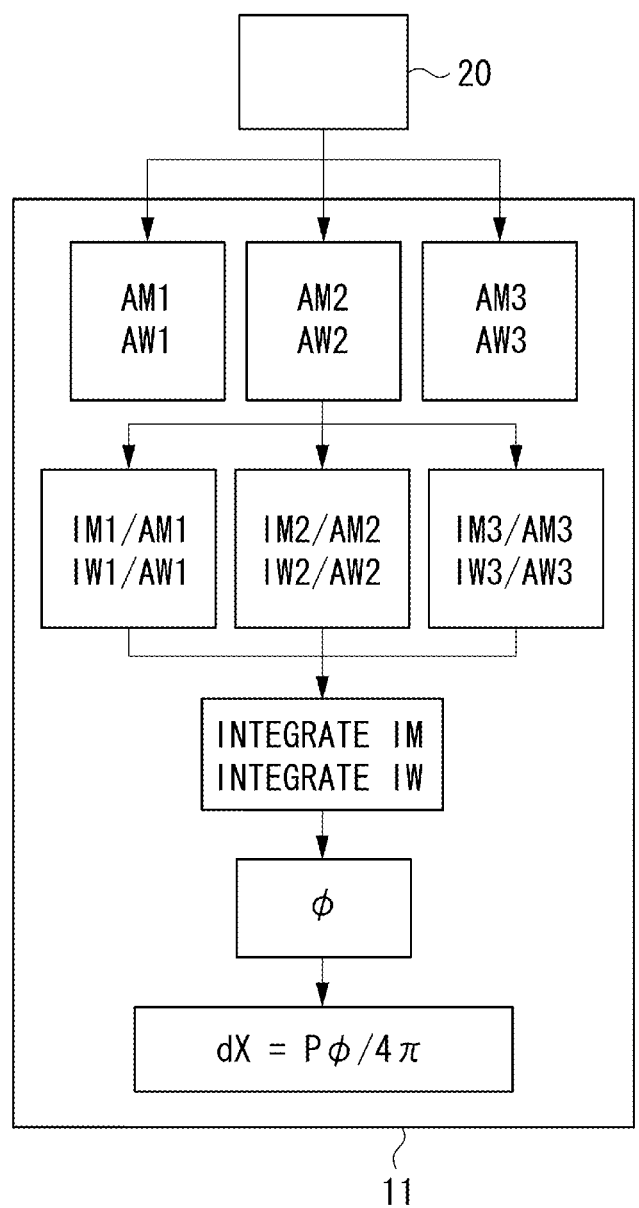

In FIG. 4B, the signal processing unit 11 processes two-beam interference fringes in three wavelength bands output from the color CCD 20. An amplitude AMi (i=1, 2, and 3) of the two-beam interference fringe of the mold and an amplitude AWi (i=1, 2, and 3) of the two-beam interference fringe from the diffraction grating of the wafer are acquired for each of three wavelengths.

Subsequently, by dividing the two-beam interference fringes IMi (i=1, 2, and 3) of the diffraction grating of the mold in the three wavelength bands by the acquired amplitude AMi of the two-beam interference fringe of the diffraction grating of the mold, two-beam interference fringes are generated, of which the intensities coincide with each other between the wavelengths. Similarly, by dividing the two-beam interference fringes IWi (i=1, 2, and 3) of the diffraction grating of the wafer in the three wavelength bands by the acquired amplitude AWi of the two-beam interference fringe of the diffraction grating of the wafer, two-beam interference fringes (interference fringes standardized by the amplitude) are generated, of which the intensities coincide with each other between the wavelengths.

Subsequently, the two-beam interference fringes from the diffraction grating of the mold and the two-beam interference fringes from the diffraction grating of the wafer in which the intensities coincide with each other between the wavelengths are combined with each other through addition to the wavelengths. A phase difference ϕ between the combined interference fringe from the diffraction grating of the mold and the combined interference fringe from the diffraction grating of the wafer is acquired, and the magnitude of the relative position deviation of the mode and the wafer is acquired by Equation (2).

In the present exemplary embodiment, the intensities of the two-beam interference fringes after the dispersion are normalized and integrated between the wavelengths to remove the wavelength dependency of the diffraction efficiencies of the diffraction gratings of the mold and the wafer. By the processing, the difference in an amplitude of the interference fringe between the wavelengths or between the mold and the wafer as illustrated in FIGS. 6A and 6B is removed, and generation of the phase difference between the integrated interference fringes may be suppressed.

Next, a position detection apparatus according to a fourth exemplary embodiment will be described with reference to FIGS. 3A, 3B, 3C, and 3D and FIG. 4C. The position detection apparatus according to the present exemplary embodiment has the same configuration as the position detection apparatus illustrated in FIG. 3A described in the second exemplary embodiment. The fourth exemplary embodiment is different from the second exemplary embodiment in the processing method of the signal executed by the signal processing unit 11. The processing method executed by the signal processing unit 11 will be described in detail.

In FIG. 4C, the signal processing unit 11 processes two-beam interference fringes in three wavelengths output from the color CCD 20. The amplitude AMi (i=1, 2, and 3) of the two-beam interference fringe of the diffraction grating of the mold, the amplitude AWi (i=1, 2, and 3) of the two-beam interference fringe of the diffraction grating of the wafer, and a phase difference ϕi (i=1, 2, and 3) between the two-beam interference fringes are acquired for each of the three wavelengths.

Subsequently, weight coefficients α, β, and γ (α+β+γ=1) in the three wavelength bands are determined. The weight coefficients α, β, and γ are determined by using the amplitude AMi and the amplitude AWi of the two-beam interference fringes. The coefficients are determined so that a weight of a signal in a wavelength band having a large amplitude is increased. In this case, when the amplitude of the two-beam interference fringe of any one of the mold and the wafer is extremely small, the coefficient may be zero. The reason is that when the amplitude is extremely small, an S/N ratio of the signal is small, and as a result, measurement precision may deteriorate. The phase difference ϕ is acquired as a weighted average of the phase differences ϕi by using the determined weight coefficients α, β, and γ, and the relative positions of the mold and the wafer are acquired by Equation (2).

The present exemplary embodiment has the following effects, as compared with the method of simply averaging the phase differences acquired in the three wavelength bands like the second exemplary embodiment or the method of processing the combined interference fringe after being normalized by the amplitude like the third exemplary embodiment. In the fourth exemplary embodiment, since a weight of a measurement value of the signal in a wavelength band having an extremely small amplitude is set to a small value, an influence due to deterioration of measurement precision of a low-intensity signal generated by decreasing the wavelength band may be suppressed.

Next, a position detection apparatus according to a fifth exemplary embodiment will be described with reference to FIGS. 7A, 7B, 7C, and 7D. The position detection apparatus according to the second exemplary embodiment uses the color filter of the color CCD as the wavelength selecting unit, while the position detection apparatus according to the present exemplary embodiment uses a dichroic mirror as the wavelength selecting unit. The wavelength selecting unit will be described in detail, and the same components as the first exemplary embodiment among other components will not be described.

Figure 7A:
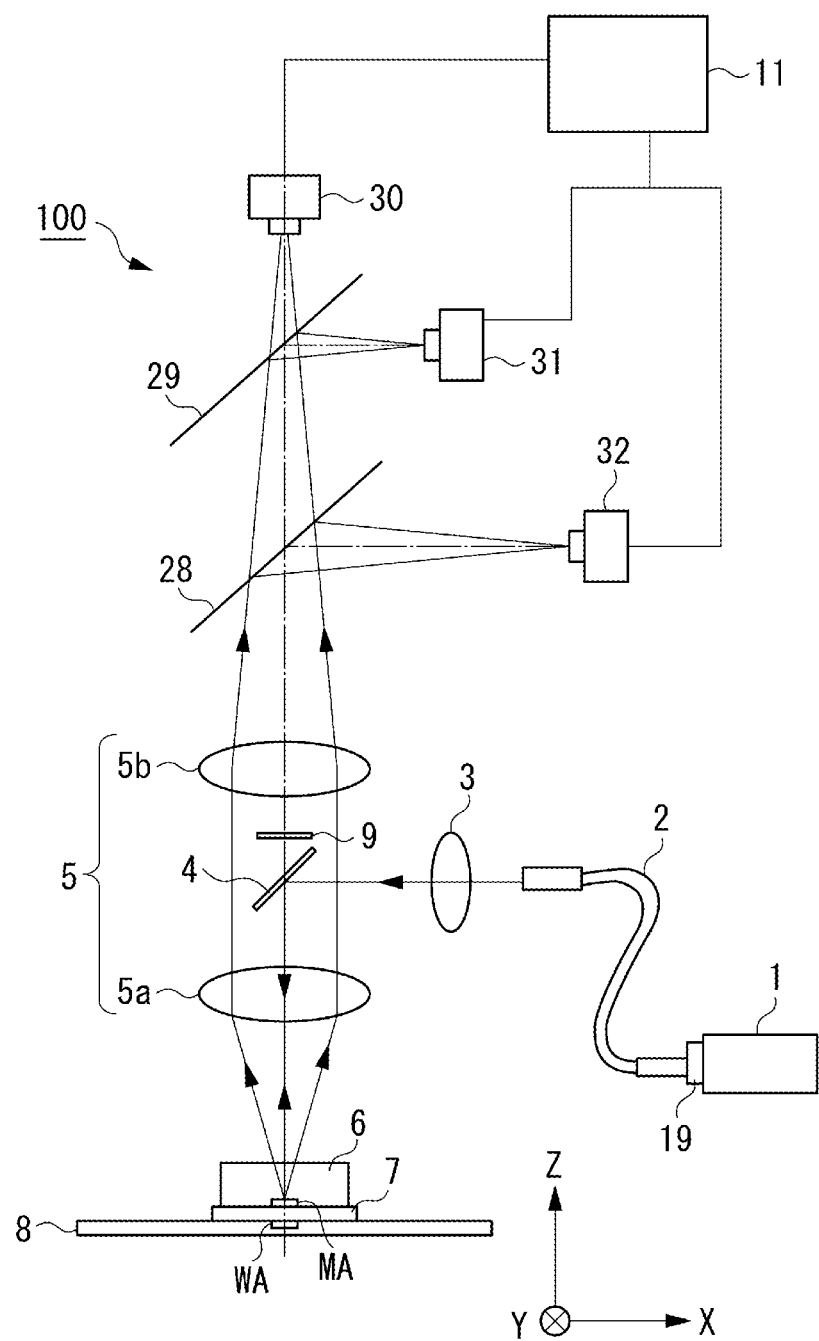
FIGS. 7A, 7B, 7C, and 7D are diagrams illustrating a position detection apparatus according to a fifth exemplary embodiment.
Figure 7B:
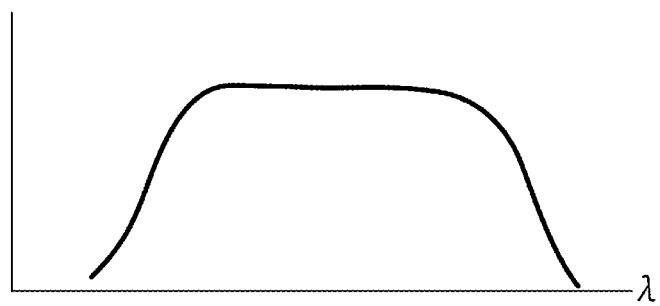

In FIG. 7A, a wavelength band of light emitted from the light source 1 illuminated to the mold and the wafer is limited by the band-pass filter 19. A wavelength selection characteristic of transmittance of the band-pass filter 19 is illustrated in FIG. 7B.

Figure 7C:
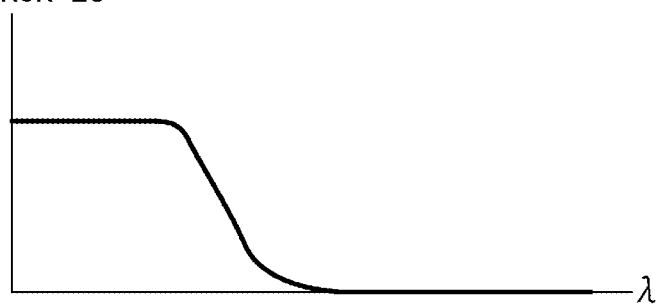

Thereafter, the plus first-order diffracted light and minus first-order diffracted light diffracted by the diffraction grating MA formed on the mold 6 and the diffraction grating WA formed on the wafer 8 pass through the detection optical system 5 and are incident onto the dichroic mirror 28. A reflection characteristic of the dichroic mirror 28 is illustrated in FIG. 7C and light of a short-wavelength side is reflected and is incident onto a CCD 32. A light receiving surface of the CCD 32 is disposed at a conjugate position on the bottom of the mold 6 with respect to the detection optical system 5, and the two-beam interference fringe of the diffraction grating MA of the mold 6 and the two-beam interference fringe of the diffraction grating WA of the wafer 8 are detected. As such, the respective interference fringes (images of the diffraction gratings) are acquired from two diffraction gratings.

Figure 7D:
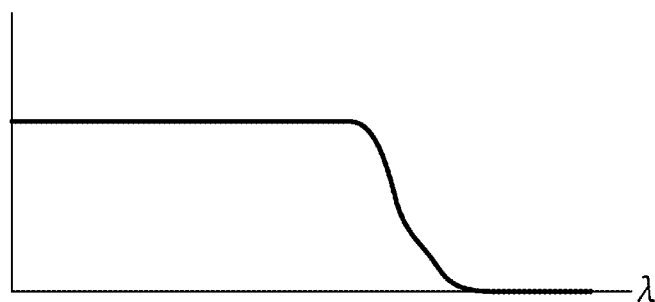

Light other than the short wavelength side that passes through the dichroic mirror 28 in the light incident onto the dichroic mirror 28 is incident onto a dichroic mirror 29. A reflection characteristic of the dichroic mirror 29 is illustrated in FIG. 7D. A medium wavelength side is reflected and is incident onto a CDD 31. A light receiving surface of the CCD 31 is disposed at a conjugate position on the bottom of the mold 6 with respect to the detection optical system 5, and the two-beam interference fringe of the diffraction grating MA of the mold 6 and the two-beam interference fringe of the diffraction grating WA of the wafer 8 are detected. As such, the respective interference fringes (images of the diffraction gratings) are acquired from two diffraction gratings.

Light of a long wavelength side other than the short wavelength side and the medium wavelength side that passthrough the dichroic mirror 29 is incident onto a CCD 30. A light receiving surface of the CCD 30 is disposed at a conjugate position on the bottom of the mold 6 with respect to the detection optical system 5, and like the case in which the two-beam interference fringe of the diffraction grating MA of the mold 6 and the two-beam interference fringe of the diffraction grating WA of the wafer 8 are detected, the respective interference fringes (the images of the diffraction gratings) are acquired from two diffraction gratings.

As such, the two-beam interference fringes in the three wavelength bands may be acquired by using the dichroic mirrors 28 and 29, the CCD 32, the CCD 31, and the CCD 30. The relative positions of the mold 6 and the wafer 8 are acquired based on the two-beam interference fringes. The signals detected by the respective CCDs are input into the signal processing unit 11 to execute the processing of acquiring the relative positions. The processing method of the two-beam interference fringe may be performed even by any one of the above-described exemplary embodiments.

The example in which a wavelength range is divided into three by using two dichroic mirrors and three CCDs is described in the present exemplary embodiment, but the number of dichroic mirrors and the number of CCDs may be increased and the number of divided ranges may be increased.

In the present exemplary embodiment, the dichroic mirrors are used as the wavelength selecting unit and different CCDs are used for the respective wavelength bands. Accordingly, even when axial chromatic aberration (focus difference) is present in the detection optical system 5, the respective CCDs may be aligned in an optical axis direction for each wavelength band. As a result, even when axial chromatic aberration is present in the detection optical system 5, the CCDs are aligned to acquire a signal having a sufficient intensity.

As the wavelength selecting unit, a band-pass filter may be used in addition to the color filter of the color CCD described in the second exemplary embodiment or the dichroic mirror of the fifth exemplary embodiment. In this case, a rotation plate with a band-pass filter that transmits a plurality of wavelength bands is disposed on an optical path before irradiating wideband light to the diffraction grating or an optical path after diffraction. By rotating the rotation plate, two-beam interference fringes in different wavelength bands may be sequentially detected by one CCD.

Next, a position detection apparatus 100 according to a sixth exemplary embodiment will be described with reference to FIGS. 8A and 8B. In the position detection apparatus according to the above-described exemplary embodiments, light is illuminated substantially vertically to the mold and the wafer, while in the position detection apparatus according to the present exemplary embodiment, light is illuminated in an oblique direction to the mold and the wafer and is received in the oblique direction.

Figure 8A:
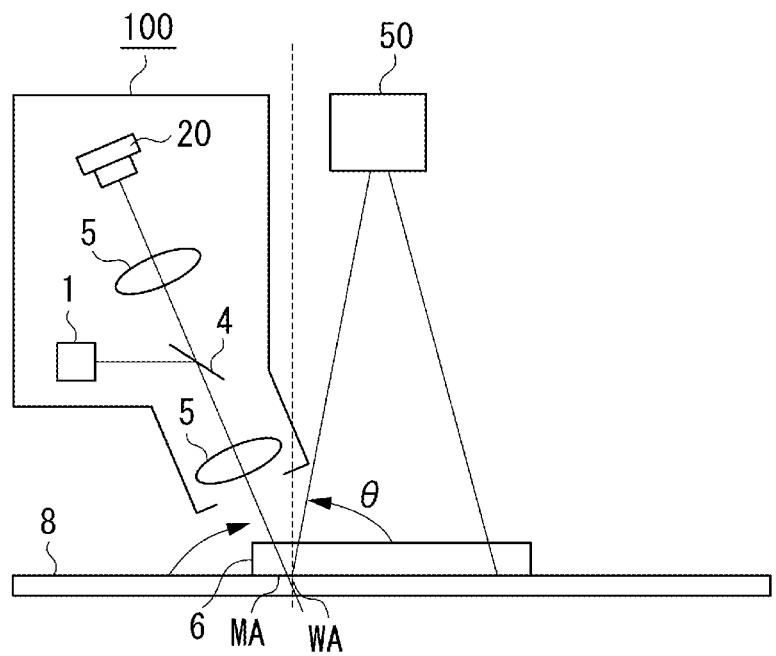
FIGS. 8a and 8B are diagrams illustrating a position detection apparatus according to a sixth exemplary embodiment.
Figure 8B:
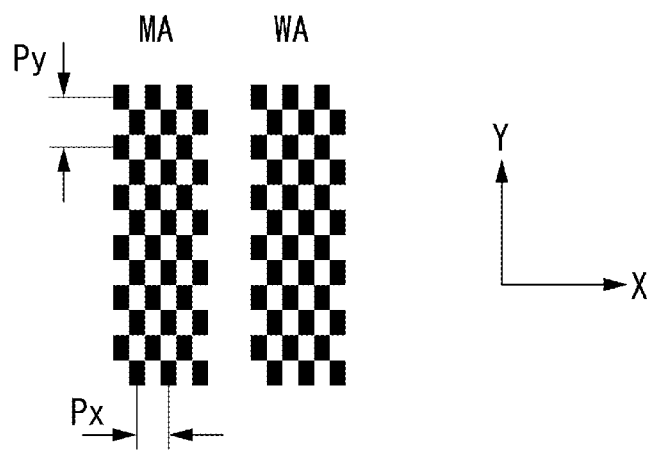

FIG. 8A illustrates the position detection apparatus 100 that detects the relative positions of the diffraction grating MA of the mold 6 and the diffraction grating WA of the wafer 8. In FIG. 8A, the position detection apparatus 100 is drawn at only one location, but the diffraction gratings which are the alignment marks are provided on the scribe lines of the respective short sides as illustrated in FIG. 2A, and the position detection apparatus 100 may be disposed at positions corresponding thereto, respectively.

Light emitted from the light source 1 is deflected by the mirror 4, and illuminates the diffraction grating MA and the diffraction grating WA from an oblique direction relative to a vertical direction of the diffraction grating. As illustrated in FIG. 8B, the diffraction grating MA and the diffraction grating WA are checkerboard-shaped diffraction gratings of a pitch Py of the Y direction as the measurement direction and a pitch Px of the X direction as the non-measurement direction. When an incident angle on the mold 6 of the position detection apparatus 100 is set as θ, and a central wavelength of an illumination band of the light source 1 for alignment is set as λc, the pitch Px of the non-measurement direction is designed as a pitch that satisfies Equation (5) below.

$$Px = \lambda c / (2 \sin \theta) \qquad (5)$$

When the pitch Px satisfies Equation (5), first-order diffracted light in the non-measurement direction and plus first-order diffracted light and minus first-order diffracted light in the measurement direction are diffracted in a reverse direction to the incident direction and are incident onto the detection optical system 5. In light of wavelengths other than the central wavelength λc within the illumination wavelength band, only light of a wavelength that enters into the NA (numerical aperture) of the detection optical system 5 is incident onto the color CCD 20 because diffraction angles of the non-measurement direction are different from each other. The two-beam interference light (interference fringe) of the plus first-order diffracted light and minus first-order diffracted light from the respective diffraction gratings of the diffraction grating MA and the diffraction grating WA is received by the color CCD 20. The relative positions of the mold 6 and the wafer 8 can be acquired by signal-processing the interference light (light receiving data) received by the light receiving unit. Anyone of the exemplary embodiments described above may be used in a method for the signal processing.

In the present exemplary embodiment, when other components (for example, a UV light source 50 or an optical system thereof) need to be disposed directly on the mold 6, the position detection apparatus 100 may be disposed at a position which does not mechanically interfere with the components.

Next, a position detection apparatus according to a seventh exemplary embodiment will be described with reference to FIGS. 9A and 9B. In the present exemplary embodiment, a position detection apparatus 200 as an inspection apparatus that inspects overlaying of different layers will be described by using diffraction gratings formed on different layers. All of the exemplary embodiments described above are directed to apparatuses that detect the relative positions of two different objects, the mold and the wafer, with the diffraction gratings provided on the mold 6 and the wafer 8. In contrast to this, the position detection apparatus 200 according to the present exemplary embodiment is an apparatus that inspects overlaying by acquiring a relative position deviation of two marks transferred onto the wafer.

Figure 9A:
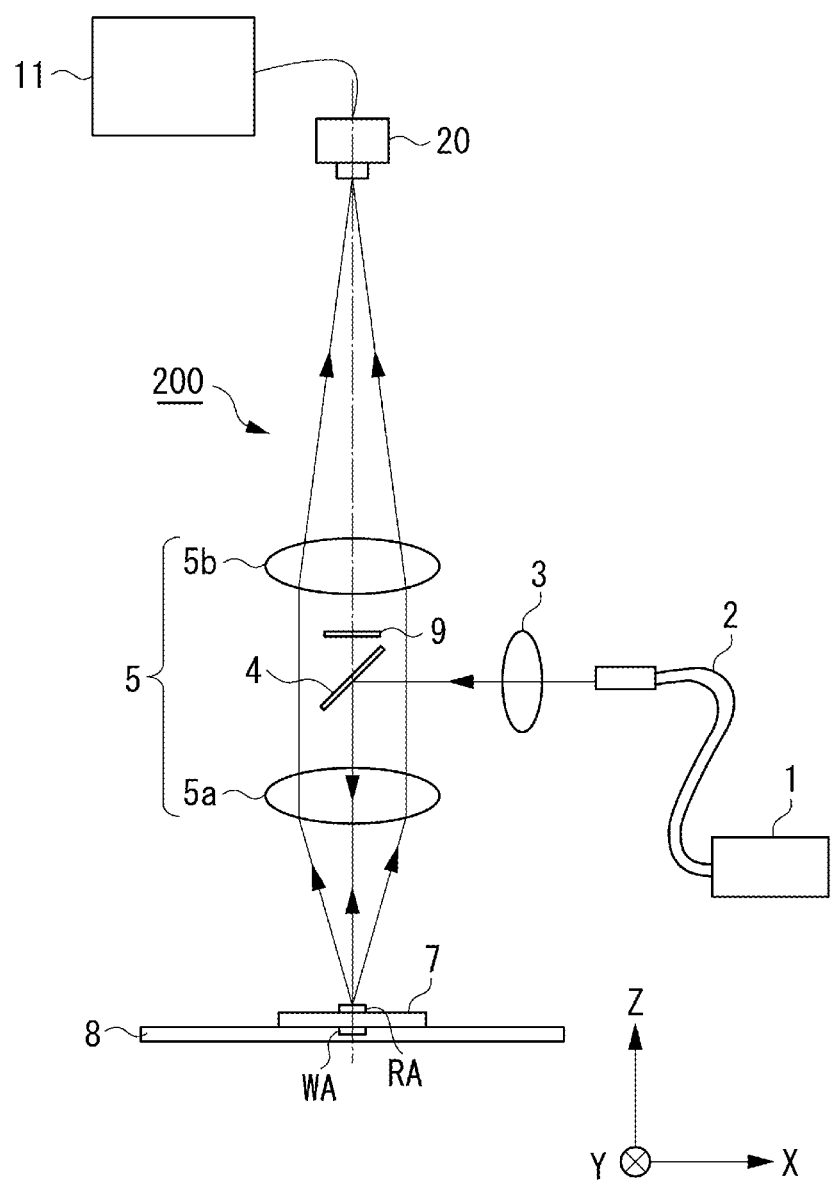
FIGS. 9A and 9B are diagrams illustrating a position detection apparatus according to a seventh exemplary embodiment.

The position detection apparatus 200 illustrated in FIG. 9A detects the diffraction grating WA and a diffraction grating RA formed on the wafer 8. Herein, a case in which a pattern is transferred to a resin 7 (imprint material) provided on the wafer 8 by the mold 6 will be described. The same reference numerals as the position detection apparatus described above will not be described.

Figure 9B:
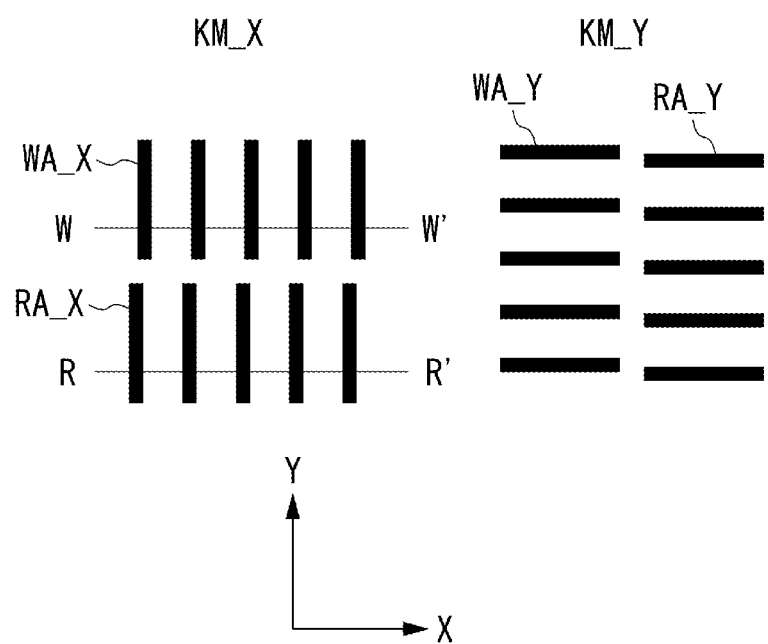

A measurement mark includes an X-directional inspection mark KM_X and a Y-directional inspection mark KM_Y as illustrated in FIG. 9B. The X-directional inspection mark KM_X includes a diffraction grating WA_X formed in a prior process of lithography and a diffraction grating RA_X formed in an imprint process. Similarly, the Y-directional inspection mark KM_Y includes a diffraction grating WA_Y formed in the prior process of lithography and a diffraction grating RA_Y formed in the imprint process. The diffraction grating RA_X and the diffraction grating RA_Y formed in the imprint process are formed on the top. The diffraction grating RA is formed by the imprint apparatus, but the diffraction grating RA may be a resist pattern formed by a conventional lithography device using light or a pattern (diffraction grating) etched with the resist pattern.

Figure 10A:
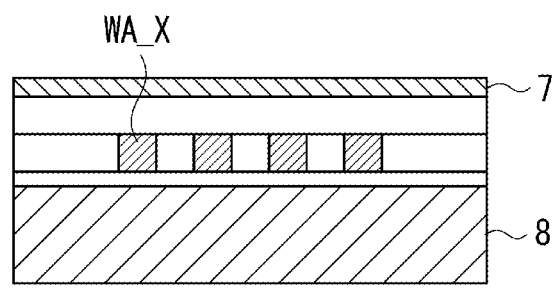
FIGS. 10A and 10B are diagrams illustrating a cross section of a diffraction grating formed on a mold and a wafer.
Figure 10B:
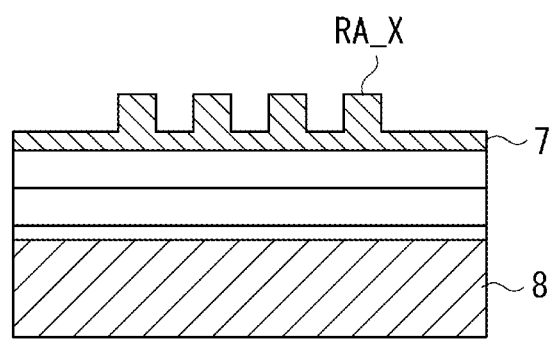

FIG. 10A is a diagram in which a cross section WW' of the diffraction grating WA_X of the X-directional inspection mark KM_X described in FIG. 9B is viewed from the Y direction. FIG. 10A illustrates a cross-sectional view of the diffraction grating WA_X formed in the prior process of lithography. FIG. 10B is a diagram in which a cross section RR' of the diffraction grating RA_X of the X-directional inspection mark KM_X described in FIG. 9B is viewed from the Y direction. FIG. 10B illustrates a cross-sectional view of the diffraction grating RA_X formed in this process. The diffraction grating RA is formed on the top, but both the diffraction grating RA and the diffraction grating WA may be formed on layers other than the top.

As such, the two-beam interference light (interference fringe) of the diffracted light of the diffraction gratings formed on different layers of the substrate is detected by the color CCD 20. By using the interference fringe (light receiving data) which is the two-beam interference light at an area where the interference fringes from the respective diffraction gratings do not overlap each other, the relative positions of different layers on the substrate are acquired. As such, the relative positions of the different layers may be acquired as different objects.

A configuration of a detection system and the method for processing the signal according to the present exemplary embodiment may adopt the configuration and the processing method illustrated in the exemplary embodiments described above.

Figure 11:
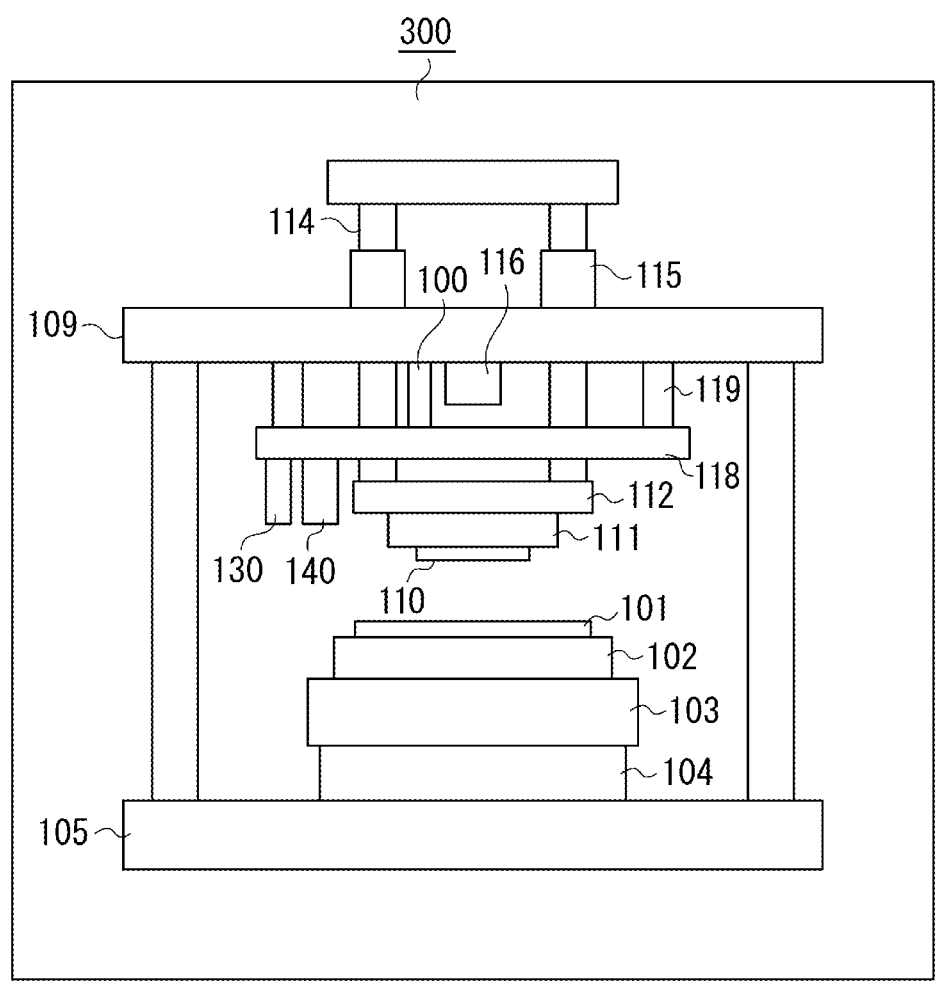
FIG. 11 is a diagram illustrating an imprint apparatus according to an eighth exemplary embodiment.

FIG. 11 is a configuration diagram of an imprint apparatus 300 according to an eighth exemplary embodiment. The position detection apparatus 100 according to any one of the first to sixth exemplary embodiments described above is provided in the imprint apparatus 300.

A configuration of the imprint apparatus 300 will be described. A wafer 101 as the substrate is held by a wafer chuck 102. A fine movement stage 103 has a rotation correction function of a Z axial center of the wafer 101 and a tilt function to correct a Z position and an inclination of the wafer 101, and is disposed on an XY stage 104 for positioning the wafer 101 at predetermined locations in the X and Y directions. Hereinafter, the fine movement stage 103 and the XY stage 104 are integrally called a wafer stage.

The XY stage 104 is mounted on a base support member 105. A bar mirror (not illustrated) is attached to the fine movement stage 103, which reflects light from a laser interferometer that measures X and Y-direction positions of the fine movement stage 103.

A pattern shape transferred onto the wafer 101 is formed on the surface of a mold 110, and the mold 110 is fixed to a mold chuck 111. The mold chuck 111 is installed on a mold chuck stage 112. The mold chuck stage 112 has a tilt function to correct a slope of a Z axial center of the mold 110.

The X and Y-direction positions of the mold chuck 111 are measured by a laser interferometer (not illustrated) supported on an alignment shelf 118. The mold chuck 111 and the mold chuck stage 112 allow UV light irradiated from a UV light source 116 to pass through the mold 110.

A mold elevating linear actuator 115 includes an air cylinder or a linear motor, and the mold elevating linear actuator 115 drives a guide bar 114 in a Z direction and presses or releases the mold 110 held on the mold chuck 111 onto the wafer 101. The alignment shelf 118 is suspended to a tabletop 109 by a support pole 119, and is penetrated by a guide bar 114.

A dispenser head 130 that supplies an imprint material (light curing resin) onto the substrate is provided on the alignment shelf 118. Further, an off-axis alignment scope 140 (hereinafter, an OA scope) is provided. A plurality of shot alignment marks on the wafer 101 is measured by using the OA scope 140 to perform pre-alignment processing. The wafer 101 is pre-aligned to the apparatus by using the OA scope 140, and the relative positions of the mold 110 and the wafer 101 are aligned by using the position detection apparatus 100. When alignment of the relative positions is completed, the imprint material is cured by irradiating the UV light source 116 to transfer a pattern on the mold 110 onto the wafer 101.

The position detection apparatus 100 that detects the relative positions of the mold and the wafer measures the relative positions of the diffraction grating of the mold and the diffraction grating of the wafer as described in the above exemplary embodiments. Precision of the alignment of the mold and the wafer may be improved by using the position detection apparatus according to the present invention.

A manufacturing method of devices (a semiconductor integrated circuit device, a liquid crystal display device, and the like) includes a process of transferring (forming) a pattern onto a substrate (the wafer, a glass plate, and a film formed substrate) by using the imprint apparatus. The manufacturing method may include a process of etching the substrate transferred with the pattern.

When other articles, such as patterned media (recording media) or optical devices, are manufactured, the manufacturing method may include another process that processes the substrate transferred with the pattern instead of etching. The article manufacturing method of the present exemplary embodiment is more advantageous than the method in the related art in terms of at least one of performance, quality, productivity, and production code of the components.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-279722 filed Dec. 21, 2011, which is hereby incorporated by reference herein in its entirety.

What is claimed is:

1. A position detection apparatus that illuminates diffraction gratings formed on two objects with light from a light source and receives diffracted light from the diffraction gratings to acquire relative positions of the two objects, the position detection apparatus comprising:

an optical system configured to cause plus n-th order diffracted light and minus n-th order diffracted light from each of the diffraction gratings to interfere with each other, where n is a natural number;
a light receiving unit; and
a processing unit,
wherein the optical system is configured to cause the plus n-th order diffracted light and the minus n-th order diffracted light from the diffraction gratings incident on the light receiving unit at different angles;
wherein the light receiving unit receives an interference fringe of the plus n-th order diffracted light and the minus n-th order diffracted light from each of the diffraction gratings formed on the two objects, and frequency of the plus n-th order diffracted light and frequency of the minus n-th order diffracted light are the same, and
wherein the processing unit acquires the relative positions of the two objects by using a phase difference between the interference fringes at an area where interference fringes of the diffracted light from the respective diffraction gratings do not overlap each other among the interference fringes of the diffracted light from each of the diffraction gratings formed on the two objects, received by the light receiving unit.

2. The position detection apparatus according to claim 1, wherein the processing unit acquires the relative positions of the two objects by using a phase difference between the interference fringes by the diffracted light from each of the diffraction gratings formed on the two objects.

3. The position detection apparatus according to claim 1, wherein the light source irradiates light having a plurality of wavelengths,
wherein the position detection apparatus further comprises a wavelength selecting unit configured to select the light having the plurality of wavelengths for each of different wavelengths, and
wherein the processing unit acquires the relative positions of the two objects based on the interference fringes by diffracted light of a wavelength selected by the wavelength selecting unit.

4. The position detection apparatus according to claim 3, wherein the processing unit acquires a phase difference of the interference fringes by the diffracted light from each of the diffraction gratings formed on the two objects for each of the different wavelengths, and acquires the relative positions of the two objects based on the phase difference acquired for each of the different wavelengths.

5. The position detection apparatus according to claim 4, wherein the processing unit acquires the relative positions of the two objects based on an average value of the phase differences acquired for each of the different wavelengths.

6. The position detection apparatus according to claim 4, wherein the processing unit acquires an amplitude of the interference fringe for each of the different wavelengths, acquires an interference fringe acquired by normalizing the interference fringe by the amplitude for each of the difference wavelengths, and acquires the relative positions of the two objects based on a phase difference between interference fringes acquired by integrating the normalized interference fringes.

7. The position detection apparatus according to claim 4, wherein the processing unit acquires an amplitude and a phase difference of the two-beam interference fringe for each of the different wavelengths, and acquires the relative positions of the two objects based on a weighted average value using the amplitude of the two-beam interference fringe.

8. The position detection apparatus according to claim 3, wherein the light receiving unit includes a color charge-coupled device, and wherein the wavelength selecting unit includes a color filter of the color charge-coupled device.

9. The position detection apparatus according to claim 3, wherein the wavelength selecting unit includes a dichroic mirror.

10. The position detection apparatus according to claim 1, wherein the diffraction gratings have a checkerboard shape, and
wherein the diffraction grating is illuminated with the light from the light source in an oblique direction relative to a vertical direction of the diffraction grating, and an interference fringe of the plus n-th order diffracted light and the minus n-th order diffracted light from the diffraction grating is received.

11. An imprint apparatus that transfers a pattern to an imprint material supplied to a substrate by using a pattern formed on a mold, the imprint apparatus comprising:
a position detection apparatus, wherein the position detection apparatus illuminates diffraction gratings formed on two objects with light from a light source and receives diffracted light from the diffraction gratings to acquire relative positions of the two objects, the position detection apparatus comprising:
an optical system configured to cause plus n-th order diffracted light and minus n-th order diffracted light from each of the diffraction gratings to interfere with each other, where n is a natural number;
a light receiving unit; and
a processing unit,
wherein the optical system is configured to cause the plus n-th diffracted light and the minus n-th order diffracted light from the diffraction gratings incident on the light receiving unit at different angles,
wherein the light receiving unit receives an interference fringe of the plus n-th order diffracted light and the minus n-th order diffracted light from each of the diffraction gratings formed on the two objects, and frequency of the plus n-th order diffracted light and frequency of the minus n-th order diffracted light are the same frequency
wherein the processing unit acquires the relative positions of the two objects by using a phase difference between the interference fringes at an area where interference fringes of the diffracted light from the respective diffraction gratings do not overlap each other among the interference fringes of the diffracted light from each of the diffraction gratings formed on the two objects, received by the light receiving unit, and
wherein the position detection apparatus acquires relative positions of the mold and the substrate by using images of two-beam interference from a diffraction grating formed on the mold and a diffraction grating formed on the substrate.

12. A method for manufacturing a device, the method comprising:
forming a pattern on a substrate by using an imprint apparatus; and
processing the substrate having the pattern formed thereon,
wherein the imprint apparatus transfers a pattern to an imprint material supplied to a substrate by using a pattern formed on a mold, the imprint apparatus comprising:
a position detection apparatus, wherein the position detection apparatus illuminates diffraction gratings formed on two objects with light from a light source and receives diffracted light from the diffraction gratings to acquire relative positions of the two objects, the position detection apparatus comprising:

an optical system configured to cause plus n-th order diffracted light and minus n-th order diffracted light from each of the diffraction gratings to interfere with each other, where n is a natural number;

a light receiving unit; and a processing unit, wherein the optical system is configured to cause plus n-th order diffracted light and minus n-th order diffracted light from the diffraction gratings formed on each of two objects incident on the light receiving unit at different angles, wherein the light receiving unit receives an interference fringe of the plus n-th order diffracted light and the minus n-th order diffracted light from each of the diffraction gratings formed on the two objects, and frequency of the plus-nth order diffracted light and frequency of the minus n-th order diffracted light are the same frequency, wherein the processing unit acquires the relative positions of the two objects by using a phase difference between the interference fringes at an area where interference fringes of the diffracted light from the respective diffraction gratings do not overlap each other among the interference fringes of the diffracted light from each of the diffraction gratings formed on the two objects, received by the light receiving unit, and wherein the position detection apparatus acquires relative positions of the mold and the substrate by using images of two-beam interference from a diffraction grating formed on the mold and a diffraction grating formed on the substrate.

13. A position detection apparatus that illuminates two diffraction gratings formed on different layers on a substrate having a plurality of layers formed thereon with light from a light source and receives diffracted light from the diffraction gratings to acquire relative positions of the different layers, the position detection apparatus comprising:

an optical system configured to cause plus n-th order diffracted light and minus n-th order diffracted light from each of the diffraction gratings to interfere with each other, where n is a natural number;

a light receiving unit; and a processing unit, wherein the optical system is configured to cause plus n-th order diffracted light and minus n-th order diffracted light from the diffraction gratings formed on each of two objects incident on the light receiving unit at different angles, wherein the light receiving unit receives an interference fringes of the plus n-th order diffracted light and the minus n-th order diffracted light from each of the two diffraction gratings formed on the different layers, and frequency of the plus n-th order diffracted light and frequency of the minus n-th order diffracted light are the same frequency, and wherein the processing unit acquires the relative positions of the different layers by using a phase difference between the interference fringes at an area where interference fringes of the diffracted light from the respective diffraction gratings do not overlap each other among the interference fringes of the diffracted light from each of the diffraction gratings formed on the different layers, received by the light receiving unit.

14. A position detecting method for illuminating diffraction gratings formed on two objects with light from a light source and receiving diffracted light from each of the diffraction gratings to acquire relative positions of the two objects, the position detecting method comprising:

causing plus n-th order diffracted light and minus n-th order diffracted light from each of the diffraction gratings to interfere with each other, where n is a natural number;

causing the plus n-th order diffracted light and the minus n-th order diffracted light from the diffraction gratings incident on a light receiving unit at different angles;

receiving, via the light receiving unit, an interference fringe of the plus n-th order diffracted light and the minus n-th order diffracted light from each of the diffraction gratings formed on the two objects, and frequency of the plus n-th order diffracted light and frequency of the minus n-th order diffracted light are the same frequency; and acquiring the relative positions of the two objects by using a phase difference between the interference infringe at an area where interference fringes of the diffracted light from the respective diffraction gratings do not overlap each other among the interference fringes of the diffracted light from each of the diffraction gratings formed on the two objects, received by the light receiving unit.

* * * * *